US010529416B2

(12) United States Patent
Soykal et al.

(10) Patent No.: US 10,529,416 B2
(45) Date of Patent: Jan. 7, 2020

(54) QUANTUM METROLOGY AND QUANTUM MEMORY USING DEFECT STATES WITH SPIN-3/2 OR HIGHER HALF-SPIN MULTIPLETS

(71) Applicant: The Government of the United States of America, as represented by the Secretary of the Navy, Arlington, VA (US)

(72) Inventors: Oney Soykal, Alexandria, VA (US); Thomas L. Reinecke, Alexandria, VA (US); Samuel G. Carter, Waldorf, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/712,403

(22) Filed: Sep. 22, 2017

(65) Prior Publication Data

US 2018/0090200 A1    Mar. 29, 2018

Related U.S. Application Data

(60) Provisional application No. 62/398,568, filed on Sep. 23, 2016.

(51) Int. Cl.
| | |
|---|---|
| *G11C 11/16* | (2006.01) |
| *G11C 11/44* | (2006.01) |
| *B81B 3/00* | (2006.01) |
| *G11C 13/04* | (2006.01) |
| *G11C 7/22* | (2006.01) |
| *G11C 13/06* | (2006.01) |

(Continued)

(52) U.S. Cl.
CPC ............ *G11C 11/44* (2013.01); *B81B 3/0032* (2013.01); *G11C 7/22* (2013.01); *G11C 11/161* (2013.01); *G11C 13/04* (2013.01); *G11C 13/06* (2013.01); *B82Y 10/00* (2013.01); *G06N 10/00* (2019.01); *G11C 11/16* (2013.01)

(58) Field of Classification Search
CPC ............ G11C 7/22; G11C 11/44; G06N 10/00
See application file for complete search history.

(56) References Cited

U.S. PATENT DOCUMENTS

| 7,667,995 B1 | 2/2010 | Leuenberger et al. |
| 7,719,071 B1 | 5/2010 | Flatte et al. |

(Continued)

OTHER PUBLICATIONS

Pavel et al. , "Silicon vacancy in SiC as a promising quantum system for single-defect and single-photon spectroscopy", Physical Review B 83, 125203 ; 2011.*

(Continued)

*Primary Examiner* — Mushfique Siddique
(74) *Attorney, Agent, or Firm* — US Naval Research Laboratory; Joslyn Barritt

(57) ABSTRACT

Devices and methods for the detection of magnetic fields, strain, and temperature using the spin states of a $V_{Si}$ monovacancy defect in silicon carbide, as well as quantum memory devices and methods for creation of quantum memory using the spin states of a $V_{Si}$ monovacancy defect in silicon carbide.

3 Claims, 11 Drawing Sheets

(51) Int. Cl.
*B82Y 10/00* (2011.01)
*G06N 10/00* (2019.01)

(56) References Cited

U.S. PATENT DOCUMENTS

| | | | | |
|---|---|---|---|---|
| 9,335,606 | B2* | 5/2016 | Hanson | B82Y 10/00 |
| 9,518,336 | B2* | 12/2016 | Markham | C30B 29/04 |
| 9,689,679 | B2* | 6/2017 | Budker | G01C 19/58 |
| 2016/0018269 | A1* | 1/2016 | Maurer | G01K 11/20 |
| | | | | 374/121 |
| 2016/0054402 | A1* | 2/2016 | Meriles | G01R 33/282 |
| | | | | 324/309 |
| 2016/0223621 | A1* | 8/2016 | Kaup | G01R 33/032 |
| 2017/0077665 | A1* | 3/2017 | Liu | H01S 1/02 |
| 2017/0261835 | A1* | 9/2017 | Koehl | G02F 3/00 |
| 2018/0136291 | A1* | 5/2018 | Pham | G01R 33/26 |
| 2018/0252781 | A1* | 9/2018 | Meriles | G01R 33/323 |

OTHER PUBLICATIONS

Cooper et al. ,"Time-resolved magnetic sensing with electronic spins in diamond", MIT; 2014.*
J.R. Weber et al., "Quantum computing with defects," Proc. Natl. Acad. Sci. 107, 8513 (2010).
E. Togan et al., "Laser cooling and real-time measurement of the nuclear spin environment of a solid-state qubit," Nature 478, 497 (2011).
H. Bernien et al., "Heralded entanglement between solid-state qubits separated by 3 meters," Nature 497, 86 (2013).
M.S. Grinolds et al., "Nanoscale magnetic imaging of a single electron spin under ambient conditions," Nature Physics 9, 215 (2013).
G. Balasubramanian, "Nanoscale imaging magnetometry with diamond spins under ambient conditions," Nature 455, 648 (2008).
F. Shi et al., "Single-protein spin resonance spectroscopy under ambient conditions," Science 347, 1135 (2015).
F. Dolde et al., "Electric-field sensing using single diamond spins," Nature Physics 7, 459 (2011).
C.C. Lo et al., "Hybrid optical-electrical detection of donor electron spins with bound excitons in silicon," Nat. Mater. 14, 490 (2015).
Ö.O. Soykal, "Sound-Based Analogue of Cavity Quantum Electrodynamics in Silicon," Phys. Rev. Lett. 107, 235502 (2011).
W. Koehl et al., "Room temperature coherent control of defect spin qubits in silicon carbide," Nature 479, 84 (2011).
A. Falk et al., "Polytype control of spin qubits in silicon carbide," Nat. Commun. 4, 1819 (2013) ("Falk 2013").
D. Christie et al., "Isolated electron spins in silicon carbide with millisecond coherence times," Nat. Mater. 14, 160 (2014).
N.T. Son et al., "Divacancy in 4H-SiC," Phys. Rev. Lett. 96, 055501 (2006).
A.L. Falk et al., "Optical Polarization of Nuclear Spins in Silicon Carbide," PRL 114, 247603 (2015).
B.S. Song et al., "Demonstration of two-dimensional photonic crystals based on silicon carbide," Opt. Express 19, 11084 (2011).

R. Maboudian et al., "Advances in silicon carbide science and technology at the micro- and nanoscales," J. Vac. Sci. Technol. A 31, 50805 (2013).
P.G. Baranov, "Silicon vacancy in SiC as a promising quantum system for single-defect and single-photon spectroscopy," Phys. Rev. B. 83, 125203 (2011).
E. Janzén et al., "The Silicon Vacancy in SiC," Physica B 404, 4354 (2009).
H. Kraus et al., "Room-temperature quantum microwave emitters based on spin defects in silicon carbide," Nature Physics 10, 157 (2014).
M. Widmann et al., "Coherent control of single spins in silicon carbide at room temperature," Nat. Mater. 14, 164 (2015).
S.G. Carter et al., "Spin coherence and echo modulation of the silicon vacancy in 4H-SiC at room temperature." Phys. Rev. B 92, 161202(R) (2015).
Ö.O. Soykal, "Silicon vacancy center in 4H-SiC: Electronic structure and spin-photon interfaces," Phys. Rev. B 93, 081207 (2016).
D. Simin et al., "All-optical dc nanotesla magnetometry using silicon vacancy tine structure in isotopically purified silicon carbide," arXiv:1511.04663v1 [cond-mat.mtrl-sci] (2016).
Ö.O. Soykal et al., "Supplementary: Quantum metrology with a single spin-3/2 defect in silicon carbide," available at http://link.aps.org/supplemental/10.1103/PhysRevB.95.081405.
A. J. Stone, Proc. R. Soc. London Ser. A 271, 424 (1963).
N. Mizuochi et al., "Continuous-wave and pulsed EPR study of the negatively charged silicon vacancy with S=3/2 and C3v symmetry in n-type 4H-SiC," Phys. Rev. B 66, 235202 (2002).
J.-P. Tetienne et al., "Spin relaxometry of single nitrogen-vacancy defects in diamond nanocrystals for magnetic noise sensing," Phys. Rev. B 87, 235436 (2013).
V. Jacques et al., "Dynamic Polarization of Single Nuclear Spins by Optical Pumping of Nitrogen Vacancy Color Centers in Diamond at Room Temperature," Phys. Rev. Lett. 102, 057403 (2009).
El. Hahn, "Spin Echoes," Phys. Rev. B, 80, 580 (1950).
T. Wolf et al., "Subpicotesla Diamond Magnetometry," Phys. Rev. X 5, 041001 (2015).
M. Loretz et al., "Radio-Frequency Magnetometry Using a Single Electron Spin," Phys. Rev. Lett. 110, 017602 (2013).
Preeti Ovartchaiyapong et al., "Dynamic strain-mediated coupling of a single diamond spin to a mechanical resonator," Nat. Commun. 5, 4429 (2014).
H. Kraus et al., "Magnetic field and temperature sensing with atomic-scale spin defects in silicon carbide," Sci. Rep. 4, 5303 (2014).
V. M. Acosta et al., "Temperature Dependence of the Nitrogen-Vacancy Magnetic Resonance in Diamond" Phys. Rev. Lett 104, 070801 (2010).
A. M. Smith et al., "Bioimaging: Second window for in vivo imaging," Nature Nanotechnology 4, 710-711 (2009).
Benjamin Pingault et al., "Coherent control of the silicon-vacancy spin in diamond," Nature Communications 8 10.1038/ncomms15579.

* cited by examiner

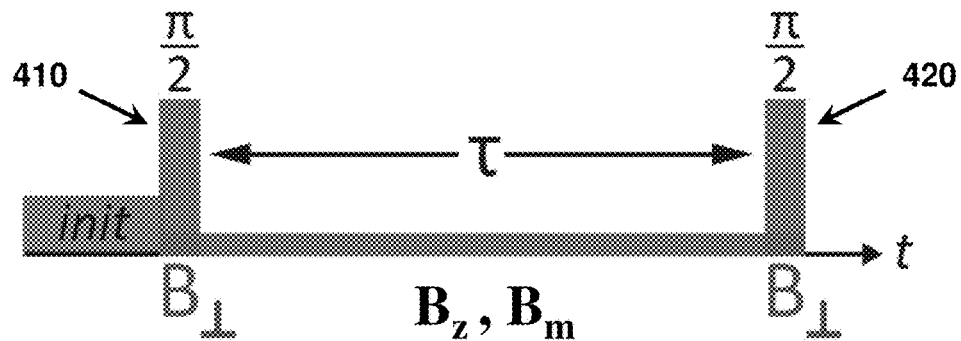
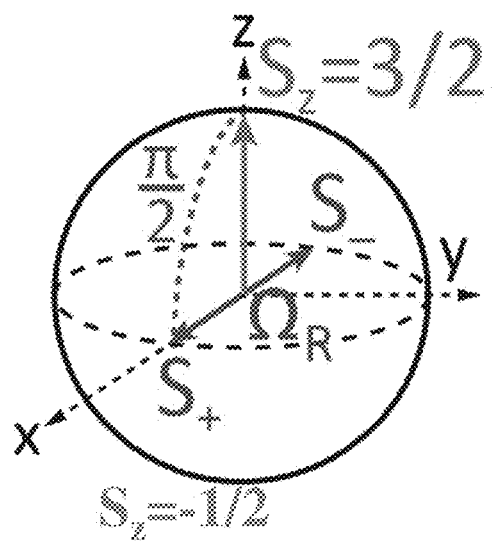
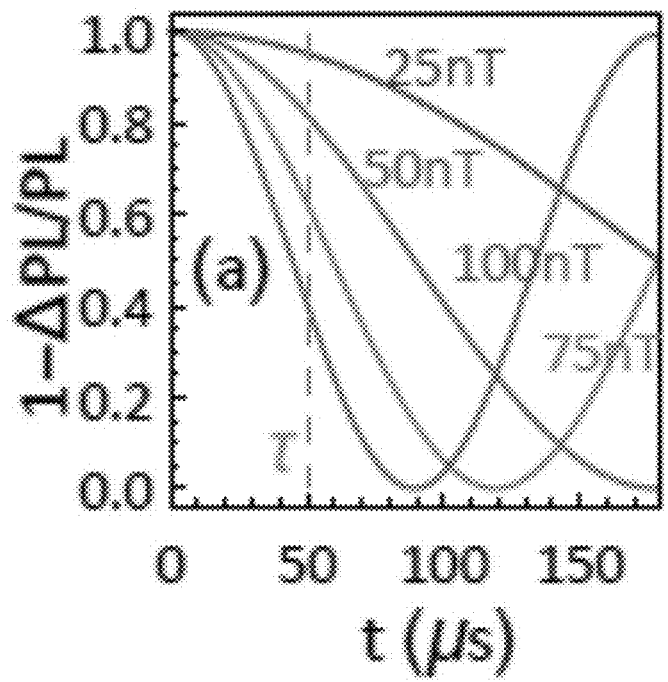
FIG. 4B
FIG. 4C
FIG. 4D

QUANTUM METROLOGY AND QUANTUM MEMORY USING DEFECT STATES WITH SPIN-3/2 OR HIGHER HALF-SPIN MULTIPLETS

CROSS-REFERENCE

This Application is a Nonprovisional of and claims the benefit of priority under 35 U.S.C. § 119 based on U.S. Provisional Patent Application No. 62/398,568 filed on Sep. 23, 2016. The Provisional Applications and all references cited herein are hereby incorporated by reference into the present disclosure in their entirety.

TECHNICAL FIELD

The present invention relates to quantum sensors and quantum memory.

BACKGROUND

Sensing is ubiquitous in modern life, with applications ranging from household and medicine sensing to sensing used in navigation and manufacturing. Memory has become a central part of information storage, communication and processing. Classical sensors and memory have made important contributions to modern life, but as technologies continue to become smaller, faster and more intelligent, the demands for highly sensitive sensors with higher spatial resolution and for high density memory with long lifetimes are increasing.

Quantum information technology is based on the use and manipulation of quantum states, and they offer exceptional increases in device capability and performance. Quantum sensors can provide great increases in sensitivity and spatial resolution, and quantum memory can make possible ultra-dense, long lived memory. Physical implementations for quantum information technology include those based on trapped atoms and ions, superconducting loops, quantum dots and defect states in solid state materials.

Sensors based on atoms and ions have limited spatial resolution and scalability, and superconducting loops and quantum dots require extensive low temperature cooling apparatus and low spatial resolution. Defect states in solids have come to be of interest for sensing and for memory because of the opportunity for room temperature operation, scalability, and high spatial resolution. The nitrogen-vacancy defect state in diamond has attracted considerable interest recently for sensing and memory. However, diamond remains expensive, challenging to fabricate and integrate into current technology, and in its natural state has information losses due to interactions with nuclei.

Technologies based on quantum information are recently opening a range of new opportunities from secure communications to quantum computing. Quantum sensing using entangled entities such as spins, atomic excitations, and photons can provide vastly improved sensitivities compared to classical technologies. Sensing using defect spin states in semiconductors is particularly important in part because of its potential for high spatial resolution and for integration with existing solid state technologies. See J. R. Weber et al., "Quantum computing with defects,"*Proc. Natl. Acad. Sci.* 107, 8513 (2010); E. Togan et al., "Laser cooling and real-time measurement of the nuclear spin environment of a solid-state qubit," *Nature* 478, 497 (2011); H. Berrien et al., "Heralded entanglement between solid-state qubits separated by 3 meters," *Nature* 497, 86 (2013); M. S. Grinolds et al., "Nanoscale magnetic imaging of a single electron spin under ambient conditions," *Nature Physics* 9, 215 (2013); G. Balasubramanian, "Nanoscale imaging magnetometry with diamond spins under ambient conditions," *Nature* 455, 648 (2008); and F. Shi et al., "Single-protein spin resonance spectroscopy under ambient conditions," *Science* 347, 1135 (2015).

Room temperature magnetic and strain sensing are being currently investigated using spin-1 and inter-valley spin states, e.g. nitrogen-vacancy (NV) deep color centers in diamond, see F. Dolde et al., "Electric-field sensing using single diamond spins," *Nature Physics* 7, 459 (2011), and phosphorous shallow donors in silicon, see C. C. Lo et al., "Hybrid optical-electrical detection of donor electron spins with bound excitons in silicon," *Nat. Mater.* 14, 490 (2015) and Ö. O. Soykal, "Sound-Based Analogue of Cavity Quantum Electrodynamics in Silicon," *Phys. Rev. Lett.* 107, 235502 (2011) ("Soykal 2011"), that require difficult microfabrication processes and experimentally challenging detection techniques.

New concepts and approaches have the potential to move quantum sensing forward to higher sensitivities in systems that are easier to implement.

The technologically important wide band gap silicon carbide (SiC) has mature growth and microfabrication technologies and favorable optical emission wavelengths. See W. Koehl et al., "Room temperature coherent control of defect spin qubits in silicon carbide," *Nature* 479, 84 (2011); A. Falk et al., "Polytype control of spin qubits in silicon carbide," *Nat. Commun.* 4, 1819 (2013) ("Falk 2013"); D. Christie et al., "Isolated electron spins in silicon carbide with millisecond coherence times," *Nat. Mater.* 14, 160 (2014); N. T. Son et al., "Divacancy in 4H-SiC," *Phys. Rev. Lett.* 96, 055501 (2006); and A. L. Falk et al., "Optical Polarization of Nuclear Spins in Silicon Carbide," *PRL* 114, 247603 (2015) ("Falk 2015"); B. S. Song et al., "Demonstration of two-dimensional photonic crystals based on silicon carbide," *Opt. Express* 19, 11084 (2011); R. Maboudian et al., "Advances in silicon carbide science and technology at the micro- and nanoscales," *J. Vac. Sci. Technol.* A 31, 50805 (2013); and P. G. Baranov, "Silicon vacancy in SiC as a promising quantum system for single-defect and single-photon spectroscopy," *Phys. Rev. B.* 83, 125203 (2011).

Uniaxial silicon carbide (4H-SiC) exhibits a negatively charged silicon monovacancy $V_{\overline{Si}}$ having spin-3/2 optical transitions. See E. Janzén et al., "The Silicon Vacancy in SiC," *Physica B* 404, 4354 (2009); H. Kraus et al., "Room-temperature quantum microwave emitters based on spin defects in silicon carbide," *Nature Physics* 10, 157 (2014) ("Kraus, *Nature Physics* 2014); M. Widmann et al., "Coherent control of single spins in silicon carbide at room temperature," *Nat. Mater.* 14, 164 (2015); S. G. Carter et al., "Spin coherence and echo modulation of the silicon vacancy in 4H-SiC at room temperature." *Phys. Rev. B* 92, 161202(R) (2015); and Ö. O. Soykal, "Silicon vacancy center in 4H-SiC: Electronic structure and spin-photon interfaces," *Phys. Rev. B* 93, 081207 (2016) ("Soykal 2016").

For the $V_{\overline{Si}}$ defect, we find an unexpected avoided crossing of its ground-state (GS) spin states forming a naturally entangled $\Lambda$-type system leading to a significant increase in sensitivity to magnetic fields. Such an avoided crossing has been observed recently. See D. Simin et al., "All-optical dc nanotesla magnetometry using silicon vacancy fine structure in isotopically purified silicon carbide," arXiv: 1511.04663v1 [cond-mat.mtrl-sci] (2016).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides devices and methods for the detection of magnetic fields, strain, and temperature using the spin states of a $V_{\overline{Si}}$ monovacancy defect in silicon carbide, and provides devices and methods for the implementation of quantum memory.

BRIEF DESCRIPTION OF THE DRAWINGS

FIGS. 4A-4D illustrate aspects of DC magnetic field detection using a $V_{\overline{Si}}$ monovacancy defect in 4H-SiC in accordance with the present disclosure.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a unique sensing scheme which uses semiconductor materials with defect states having spin-3/2 (or other half spin multiplet) ground state configurations. Such materials provide qualitatively a unique opportunity in quantum sensing due to unusual entanglement properties of their spin states, their Kramer's degeneracy, and their reduced losses.

Thus, the present invention utilizes the negatively charged silicon monovacancy $V_{\overline{Si}}$ having spin-3/2 optical transitions in uniaxial SiC (4H-SiC) to develop novel sensing schemes resulting in extraordinary sensitivities in magnetic, strain, and temperature sensing.

The degeneracy in the entangled spin states relating to the $V_{\overline{Si}}$ defect also allows for coherent control by using static magnetic fields. In addition, we obtain an important relationship between its GS zero-field splitting (ZFS) and strain coupling that can be employed for on-chip strain detection using realistic SiC micro-electromechanical systems (MEMS).

Figure 1:
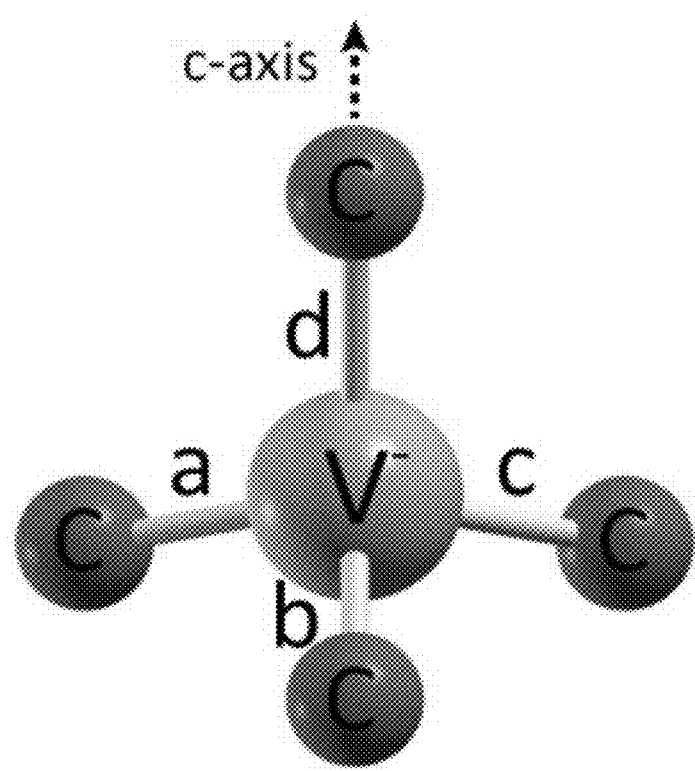
FIG. 1 is a block schematic depicting the structure of a $V_{\overline{Si}}$ monovacancy defect in 4H-SiC.

As illustrated in FIG. 1, the silicon monovacancy $V_{\overline{Si}}$ in hexagonal silicon carbide (4H-SiC) is a point defect with $C_{3v}$ symmetry, and consists of a negatively charged silicon vacancy $V^-$ surrounded by four carbon (C) atoms. It has five active electrons, four from the $sp^3$ dangling bonds a, b, c, and d between the Si and C atoms and one from the extra charge $V^-$.

There are also two possible sites for the formation of $V_{\overline{Si}}$ in a uniaxial SiC: a so-called "hexagonal" (h) site and a "cubic" (k) site. Traditionally, the transition from the ground state to the first (second) excited state in the optical spectra is identified as V1 (V1') or V2 (V2') depending on whether it originates from the k-site or the h-site defect, respectively. These transitions have different wavelengths.

Figure 2A:
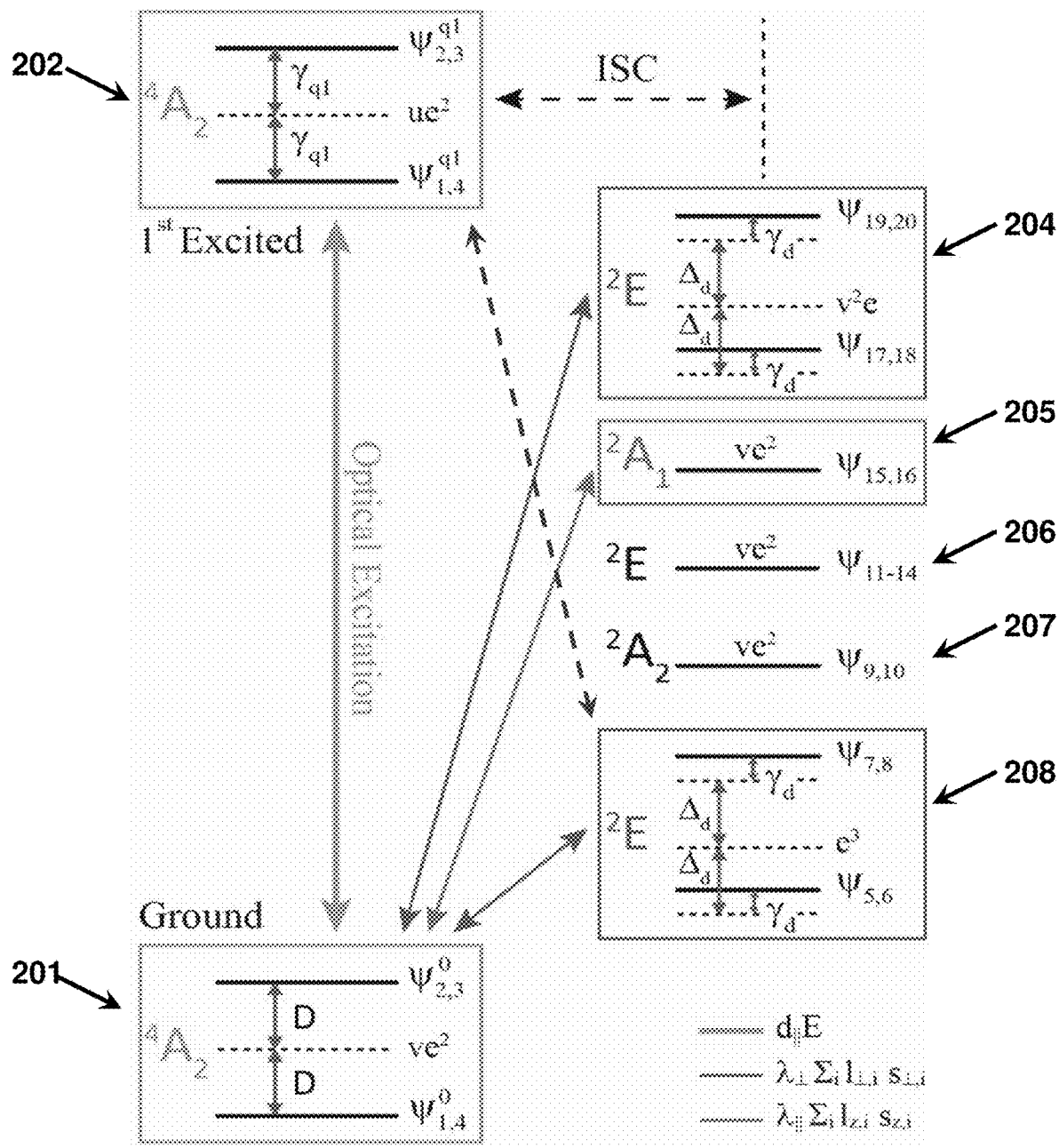
FIGS. 2A and 2B are schematics illustrating aspects of ground state (GS) and excited state (ES) electronic structures and wave functions of a $V_{\overline{Si}}$ monovacancy defect in 4H-SiC.
Figure 2B:
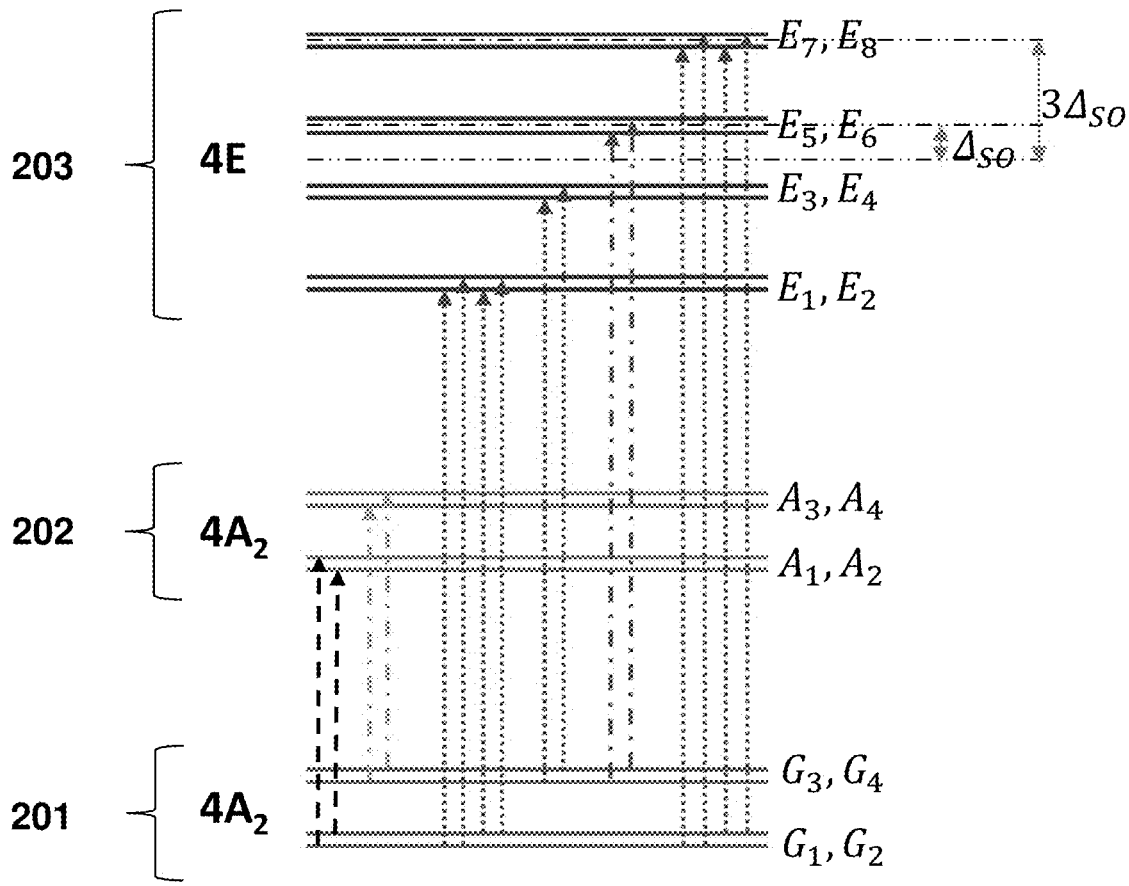

FIG. 2A and FIG. 2B illustrates aspects of the ground and excited states of the $V_{\overline{Si}}$ vacancy used in accordance with the present invention.

FIG. 2A illustrates the electronic structure of a $V_{\overline{Si}}$ monovacancy from its ground state (GS) 201 up to its first optically active excited state (ES) 202. All states have a two-fold Kramer's spin degeneracy due to odd number of total electrons involved in this defect. The doublets with spin-1/2 labeled as 204, 205, 206, 207, and 208 are "dark" doublets, i.e., are optically inactive.

FIG. 2B illustrates aspects of the optical transitions from the ground state (GS) 201 to first two optically active excited states (ES) 202 and 203.

As seen in FIG. 2A, both the ground state GS 201 and the excited state ES 202 have $^4A_2$ orbital symmetry.

As seen in FIG. 2A, the GS and ES 202 of the $V_{\overline{Si}}$ vacancy has a quartet (S=3/2) spin configuration. The GS has a zero field splitting (ZFS) of 2D~70 MHz (see Carter, supra) between the spin $m_s=\pm 3/2$ and $m_s=\pm 1/2$ states due to the spin-spin interactions between its electrons. See Soykal 2016, supra. Similarly, ES 202 has a zero field splitting (ZFS) labeled as $\gamma_{q1}$. Neither state has any spin-orbit coupling (SO) related energy splittings or shifts due to symmetry restrictions.

Optical excitation of the $V_{\overline{Si}}$ vacancy from the ground state GS to the excited state ES 202 can be achieved with a laser primarily polarized parallel to the c-axis of the defect (having an electric field parallel to the c-axis, labeled as $E_\parallel$).

These optical excitations of the ES 202 and 203 can be achieved either resonantly or off-resonantly. After the excitation, both ES 202 and 203 can decay back to the GS by an emission of a photon with the same polarization characteristics of the excitation laser in a timescale determined by the lifetime of the ES.

Alternatively, ES 202 and ES 203 can also relax through a mixture of dark doublet states $^2E$ 203, $^2A_1$ 204, $^2E$ 205, $^2A_2$ 206, and $^2E$ 207 shown in FIG. 2A. This relaxation does not involve any emission of a photon. These doublet states are ordered in energy on the right side of the FIGURE, descending from higher energy at the top to lower energy at the bottom. Because these doublet states are energetically very close to each other, they will also exhibit strong spin mixing among them due to increased SO coupling.

The radiationless relaxation of ES 202 and ES 203 to the dark doublet states is governed by the interaction of electrons and the lattice due to the SO coupling. This leads to a spin-selective decay path known as the inter-system crossing (ISC) shown in the FIG. 2A, whereby the ES can transition back to the ground state primarily by means of phonon emission, with different transition rates for each spin multiplicity $m_s=\pm 3/2$ and $m_s \pm 1/2$.

Although the overall ISC will also involve a mixture of $^2E$ 203, $^2A_1$ 204, $^2E$ 205, and $^2A_2$ 206 states as well, the ES 202 preferentially relaxes first to the doublet state $^2E$ 207 then to the GS.

While the optical emissions from ES 202 and ES 203 to GS have the same transition rates for spin $m_s=\pm 3/2$ and $m_s \pm 1/2$ states, the ISC mechanism will favor either the $m_s=\pm 3/2$ state if ZFS of GS is negative; otherwise it will favor the $m_s=\pm 1/2$ state. Therefore, after few cycles of optical excitation by a laser, the $V_{\overline{Si}}$ will be spin-polarized into the $m_s=\pm 3/2$ state.

A brief discussion of the GS spin Hamiltonian of the $V_{\overline{Si}}$ defect is provided here as a basis for novel sensing protocols. A detailed description of the Hamiltonian of the $V_{\overline{Si}}$ defect and of the magnetic coupling, strain coupling, and temperature dependence of the ground and excited states of the $V_{\overline{Si}}$ defect is not provided here for the sake of brevity, but is provided in the supplementary material to Soykal 2016 entitled "Supplementary: Quantum metrology with a single spin-3/2 defect in silicon carbide," ("Supplementary Material"), the entirety of which is incorporated by reference into the present disclosure.

The ground state wave functions $\Psi_i^0$ are perturbed due to the energetically close nearby doublet states. This perturbation is defined by the SO potential $V_{so}=\Sigma_i \lambda_{\square} l_{z,i} 8_{z,i}+\lambda \perp (l_x, i 8_{x,i}+1_{x,i} 8_{x,i})$, where the orthogonal and longitudinal SO coupling parameters are along the defect's basal plane and c-axis are $\lambda_\perp$ and $\lambda_\square$, respectively.

Using symmetry-adapted multi-particle wave functions expressed in terms of the molecular orbitals (MOs), we obtain the SO corrected ground state wave functions $\Psi_{is}^o = \Psi_i^o + \Sigma_j \alpha_{i,j} \Psi_j$ up to the first order perturbation coefficients $\alpha_{i,j}$. See Soykal 2016 and Supplementary Material, supra.

The ground state wave functions $\Psi_i^0$ that are perturbed due to the energetically close doublet states transform into the following SO corrected final form:

$$\Psi_1^{so}(m_s=\pm 3/2)=\Psi_1^0+\alpha_{1,8}\Psi_8+\alpha_{1,20}\Psi_{20}$$

$$\Psi_2^{so}(m_s=+1/2)=\Psi_2^0+\alpha_{2,6}\Psi_6+\alpha_{2,15}\Psi_{15}+\alpha_{2,1}\Psi_{18}$$

$$\Psi_3^{so}(m_s=-1/2)=\Psi_3^0+\alpha_{3,5}\Psi_5+\alpha_{3,16}\Psi_{16}+\alpha_{3,17}\Psi_{17}$$

$$\Psi_4^{so}(m_s=\pm 3/2)=\Psi_4^0+\alpha_{4,7}\Psi_7+\alpha_{4,19}\Psi_{19}$$

(see FIG. 2A). First order perturbation coefficients $\alpha_{1,8}$, $\alpha_{1,20}$, $\alpha_{2,6}$, $\alpha_{2,15}$, $\alpha_{2,18}$, $\alpha_{3,5}$, $\alpha_{3,16}$, $\alpha_{3,17}$, $\alpha_{4,7}$, and $\alpha_{4,19}$ are given in terms of the longitudinal and orthogonal (with respect to the c-axis) SO coupling parameters $\lambda_{\square,\perp}$ and the states' energies $E_i$. See Soykal 2016 and Supplementary Material, supra.

The interaction between the GS spins and a magnetic field is given by the fully relativistic multi-particle Hamiltonian $$H_B = \sum_i \mu_B (l_i + g_e 8_i) B / \hbar + \sum_i e^2 (B \times d_i)^2 / 8mc^2 + e \sum_{i,j} (8_i \times \nabla_r V_k(r_{i,j})) (B \times d_i)^2 / 4m^2 c^3$$

where i and j are electron and nuclear indices, where $g_e$, $\mu_B$, e, m, and c are the bare electron g-factor, Bohr magneton, electron charge, electron mass, and speed of light, respectively, and where $r_{ij}$ is the ith electron's position relative to the jth nucleus. See A. J. Stone, *Proc. R. Soc. London Ser. A* 271, 424 (1963)

The position vector of an electron relative to an arbitrary origin is d, with the electron's angular momentum/about this origin given by $l=d\times p$. Thus, the first term in the Hamiltonian corresponds to the Lande g-factor known in the art.

The second term of the Hamiltonian, proportional to $B^2$ and independent of the spin, simply shifts the energy levels, and can be disregarded in the analysis of interaction between the GS spins and a magnetic field.

The last term of the Hamiltonian is the relativistic correction to the first term due to the nuclear potentials $V_k$. It can be simplified to the tensor form $h_r=s\overline{G}B$. See Supplementary Material, supra.

In the basis of the SO corrected wave functions $\Psi_1^{so}$-$\Psi_4^{so}$, we find no orbital magnetic moment contribution to the g-factor to first order in $\alpha_{i,j}$ coefficients. Second-order contributions would be much smaller than the reported shifts $\Delta g=(6\pm 1)\times 10^{-4}$ in $g_e$, i.e., $\alpha_{i,j}^2 \square \eta_z^e, \eta_\perp^e, \eta_\perp^a$, see N. Mizuochi et al., "Continuous-wave and pulsed EPR study of the negatively charged silicon vacancy with S=3/2 and $C_{3v}$ symmetry in n-type 4H-SiC," *Phys. Rev. B* 66, 235202 (2002), and so the second order SO contributions can be omitted.

Based on this analysis, the final $V_{\overline{Si}}$ ground state spin Hamiltonian is obtained in the $\Psi_1^{so}$-$\Psi_4^{so}$ basis in terms of $h_-=\mu_B g_\perp B_-$, $h_+=\mu_B g_\perp B_+$, and $h_z=g_\square \mu_B B_z$ for a magnetic field $B=\{B_x, B_y, B_z\}$, where the z-axis is along the defect's c-axis and $B\pm=B_x \pm iB_y$:

$$H_B = \begin{pmatrix} D & \sqrt{\frac{3}{8}} h_- & -i\sqrt{\frac{3}{8}} h_+ & \frac{3}{2} h_z \\ \sqrt{\frac{3}{8}} h_+ & -D+\frac{1}{2} h_z & h_- & \sqrt{\frac{3}{8}} h_+ \\ \sqrt{\frac{3}{8}} h_- & h_+ & -D-\frac{1}{2} h_z & -i\sqrt{\frac{3}{8}} h_- \\ \frac{3}{2} h_z & \sqrt{\frac{3}{8}} h_- & i\sqrt{\frac{3}{8}} h_+ & D \end{pmatrix}.$$

Based on this Hamiltonian, the inventors calculated the ZFS 2D of the $V_{\overline{Si}}$ defect as 2D=68 MHz, which was in good agreement with obtained experimental values, see Kraus, *Nature Physics* 2014, supra; Widman, supra, and Carter, supra, with relativistically corrected g-factors of $g_\square=g_e+(\eta_\perp^a+\eta_\perp^e)/3$ and $g_\perp=g_e+\eta_z^e/3+(\eta_\perp^a+\eta_\perp^e)/6$.

Because of the near $T_d$ symmetry of the 3/2 $V_{\overline{Si}}$ defect, $\eta_z^e \approx (\eta_\perp^a+\eta_\perp^e)/2$ leads to an almost isotropic g-factor $g_\square \approx g_\perp$. In such an isotropic case, the relativistic g-factors differ from the bare electron g-factor $g_e$ by $\Delta g \approx 2\eta_z^e/3$, and $\eta_z^e$ can be calculated as roughly $(9\pm 1.5)\times 10^{-4}$, consistent with values obtained through experimentation. See Mizuochi, supra.

The GS spin Hamiltonian shown above can be put into the familiar single-spin (S=3/2) form $H_B=D(S_z^2-5/4)+\mu_B S_g B/\hbar$ after a unitary transformation from the defect's basis to a spin-3/2 basis where $\overline{g}=\text{diag }\{g_\square, g_\square, g_\perp\}$. See Supplementary Material, supra.

Figure 3A:
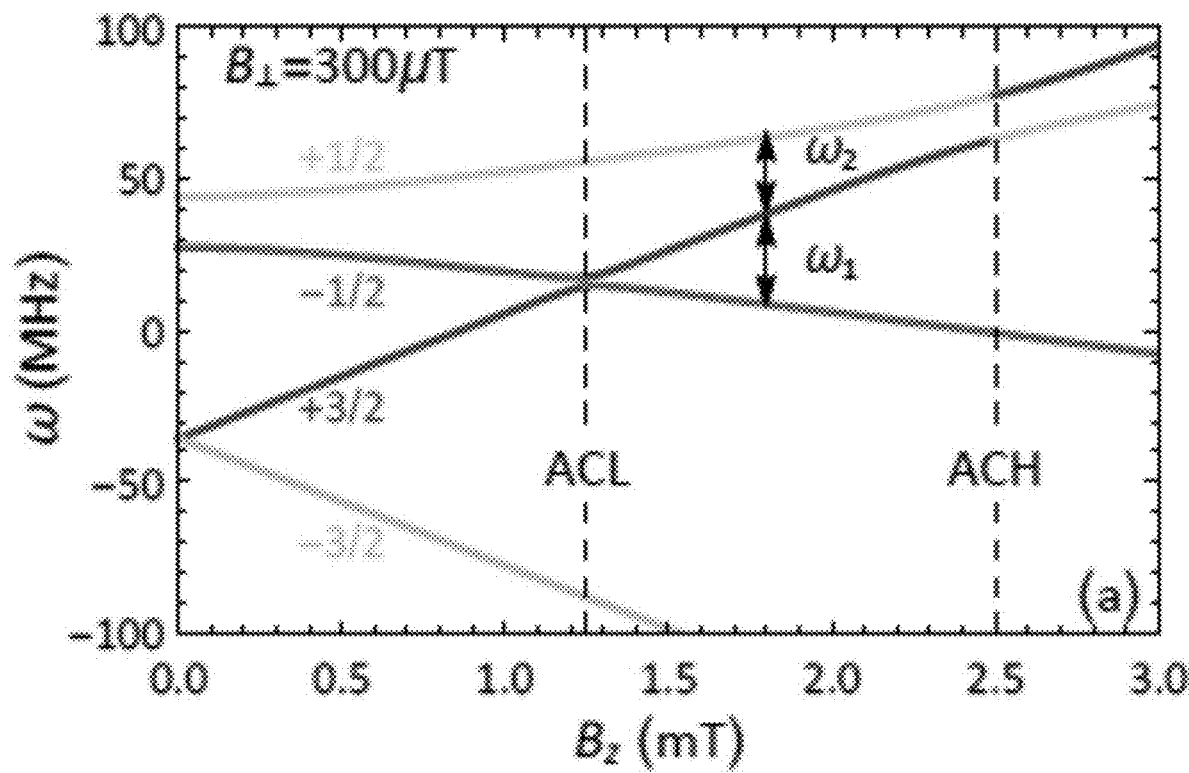
FIGS. 3A-3C are plots illustrating ground state (GS) spin splittings between spin states $m_s$: $3/2 \leftrightarrow -1/2$ ($\omega_1$) and $m_s$: $3/2 \leftrightarrow -1/2$ ($\omega_2$) of a $V_{\overline{Si}}$ monovacancy defect in 4H-SiC for various magnetic fields $B_z$ (along the c-axis) with fixed $B_\perp$ (along the basal plane).
Figure 3B:
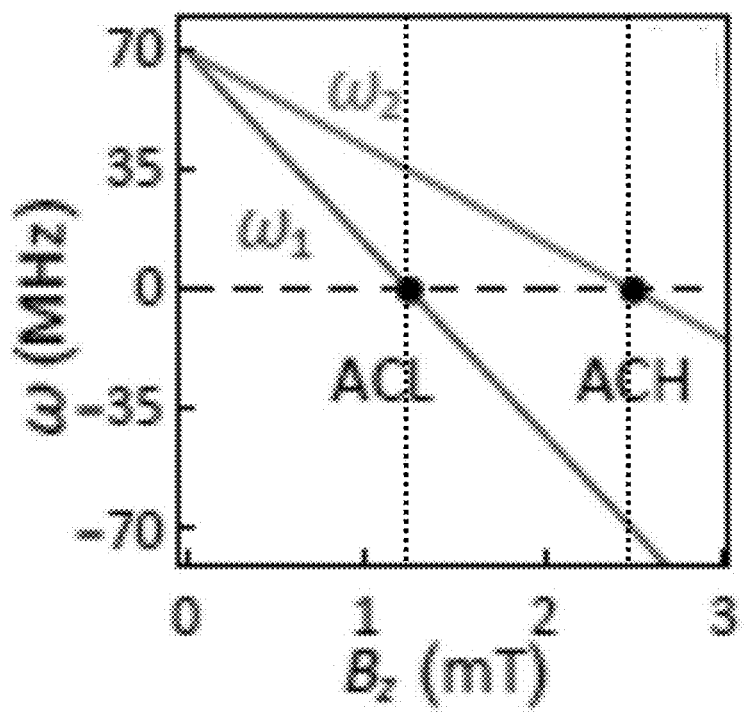
Figure 3C:
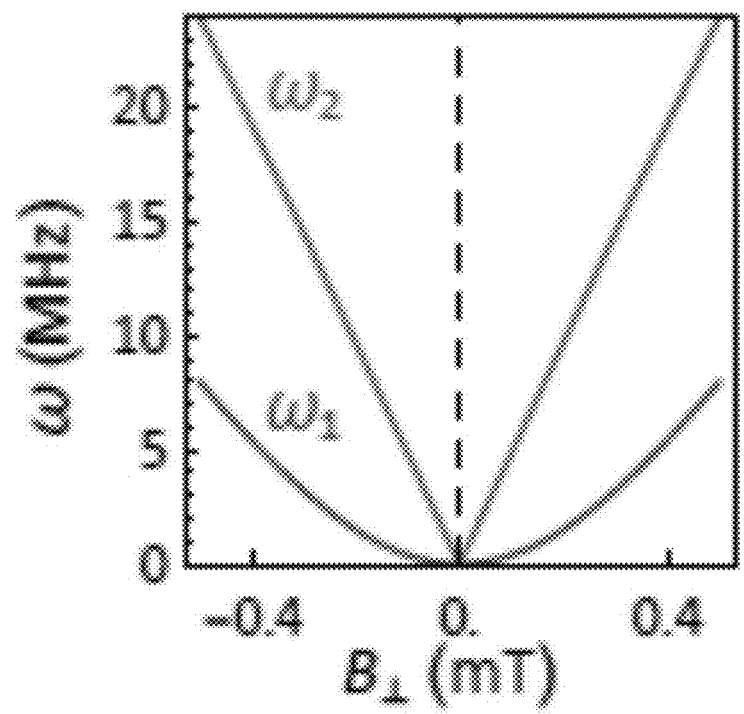

FIGS. 3A-3C are plots illustrating how the energies of the spin projection states $m_s=-3/2, +3/2, -1/2$, and $+1/2$ behave for various magnetic fields $B_z$ along the c-axis in the presence of a small fixed $B_\perp$ applied in the basal plane.

In the presence of the $B_\perp$ and $B_z$ fields, the energies for the $m_s=+3/2$ and $m_s=-1/2$ states can approach one another, and they can become coupled, or "entangled." Although, the $m_s=+3/2$ and $m_s=-1/2$ states have a prohibited $\Delta m_s=\pm 2$ transition between one another, these states are still allowed to couple to another third state $m_s=+1/2$. Through this additional $m_s=+1/2$ coupling, an energy level repulsion between the $m_s=+3/2$ and $m_s=-1/2$ states can still occur, and causes there to be an "avoided level crossing" between these two states. This is reminiscent of a ∧-type entanglement observed in atomic systems. Examination of the Rabi oscillations between $m_s=+3/2$ and $m_s=-1/2$ reveals that this third $m_s=1/2$ state remains unpopulated due to destructive quantum interference between $3/2 \leftrightarrow 1/2$ and $-1/2 \leftrightarrow 1/2$ transitions, and therefore it doesn't affect the populations of $m_s=+3/2$ and $m_s=-1/2$.

FIG. 3A illustrates the energies of the spin projection states $m_s$-3/2, +3/2, -1/2, and +1/2 when a $B_\perp=300$ μT is applied to a SiC sample having a spin-3/2 $V_{\overline{Si}}$ monovacancy. This magnetic field $B_\perp$ here is chosen randomly (as long as $B_\perp \ll B_z$) to demonstrate the avoided crossing in a visible size. As illustrated in FIG. 3A, the energy of the $m_s=+3/2$ state increases with increased $B_z$ while the energy of the $m_s=-1/2$ state decreases, such that the energy difference $\omega_1$ between the $m_s=+3/2$ and $m_s=-1/2$ approaches zero. However, as shown in FIG. 3A, because of the entanglement of the $m_s=+3/2$ and $m_s=-1/2$ states, their energies do not become equal, i.e., do not cross. The minimum of $\omega_1$ (belonging to the $+3/2 \leftrightarrow -1/2$ transition) occurring at a fixed $B_z$ magnetic field referred to herein as the "avoided crossing low," or "ACL" magnetic field shown in FIG. 3A.

This avoided level crossing between the $m_s=+3/2$ and $m_s=-1/2$ states occurs at a fixed $B_z$ regardless of the magnitude of the $B_\perp$ field present as long as it is much smaller than the $B_z$, i.e. $B_z \gg B_\perp$.

Thus, in the exemplary case illustrated in FIG. 3A, in the presence of a 300 μT $B_\perp$ field, the spin states of a SiC sample having a spin-3/2 $V_{\overline{Si}}$ monovacancy exhibit a minimum energy difference $\omega_1$ between the $m_s=+3/2$ and $m_s=-1/2$ states at an ACL $B_z$ value of 1.25 mT. Other applied $B_\perp$ fields may result in different ACL $B_z$ values.

As also illustrated in FIG. 3A, a minimum energy difference $\omega_2$ between the $m_s=+3/2$ and $m_s=+1/2$ states occurs at an ACH ("avoided crossing high") $B_z$ value of 2.5 mT. Other applied $B_\perp$ fields may result in different ACH $B_z$ values, however this will be quite negligible due to $B_z \gg B_\perp$.

As shown in FIG. 3B, at a fixed $B_\perp$, both $\omega_1$ and $\omega_2$ decrease linearly with $B_z$, with $\omega_1$ decreasing at a faster rate (higher slope) than $\omega_2$, indicating that $\omega_1$ is more sensitive to changes in $B_z$ than is $\omega_2$. As shown in FIG. 3B, energy level crossings corresponding to $\omega_{1,2}=0$ occur at a $B_{ACL}=1.25$ mT and a $B_{ACH}=2.5$ mT.

As illustrated in FIG. 3C, the transition energy $\omega_1$ exhibits a quadratic behavior whereas the transition energy $\omega_2$ exhibits a linear behavior with respect to the $B_\perp$ field. This can be understood from the unique ∧-type entanglement occurring at the ACL field as described above. Hence, the energy gap $\omega_1$ between the relevant states at this ACL increases much slowly than the energy gap $\omega_2$ at ACH with increasing the $B_\perp$ magnetic fields. This makes the ACL regime suitable for quantum sensing.

As will now be described, the present invention takes advantage of all these optical, electronic, and spin properties of the $V_{\overline{Si}}$ monovacancy defect in 4H-SiC to provide extremely sensitive magnetic field sensors, strain sensors, and temperature sensors that have extraordinary spatial resolution (down to atomic scale). The inventors also show that sensors developed using spin-3/2 defects will be extremely robust and resilient against any unwanted environmental fluctuations (e.g. external and/or local fluctuations of strain, electric field, temperature, nuclear interactions) due to Kramer's degeneracy of its spin states.

In a first embodiment, a uniaxial SiC crystal (4H-SiC) having a 3/2 spin $V_{\overline{Si}}$ monovacancy as described above can be incorporated into a sensor that can be used to detect external DC and/or AC magnetic fields $B_m$ having a component along the c-axis of the SiC crystal.

FIGS. 4A-4D illustrate aspects of a DC magnetic field sensor that incorporates a SiC crystal having a 3/2 spin $V_{\overline{Si}}$ monovacancy in accordance with the present invention.

A DC magnetic field sensor in accordance with one or more aspects of the present invention uses the identification of the ACL point described above along with a Ramsey-type magnetic field sensing scheme known in the art to detect a small target magnetic field $B_m$.

Figure 4A:
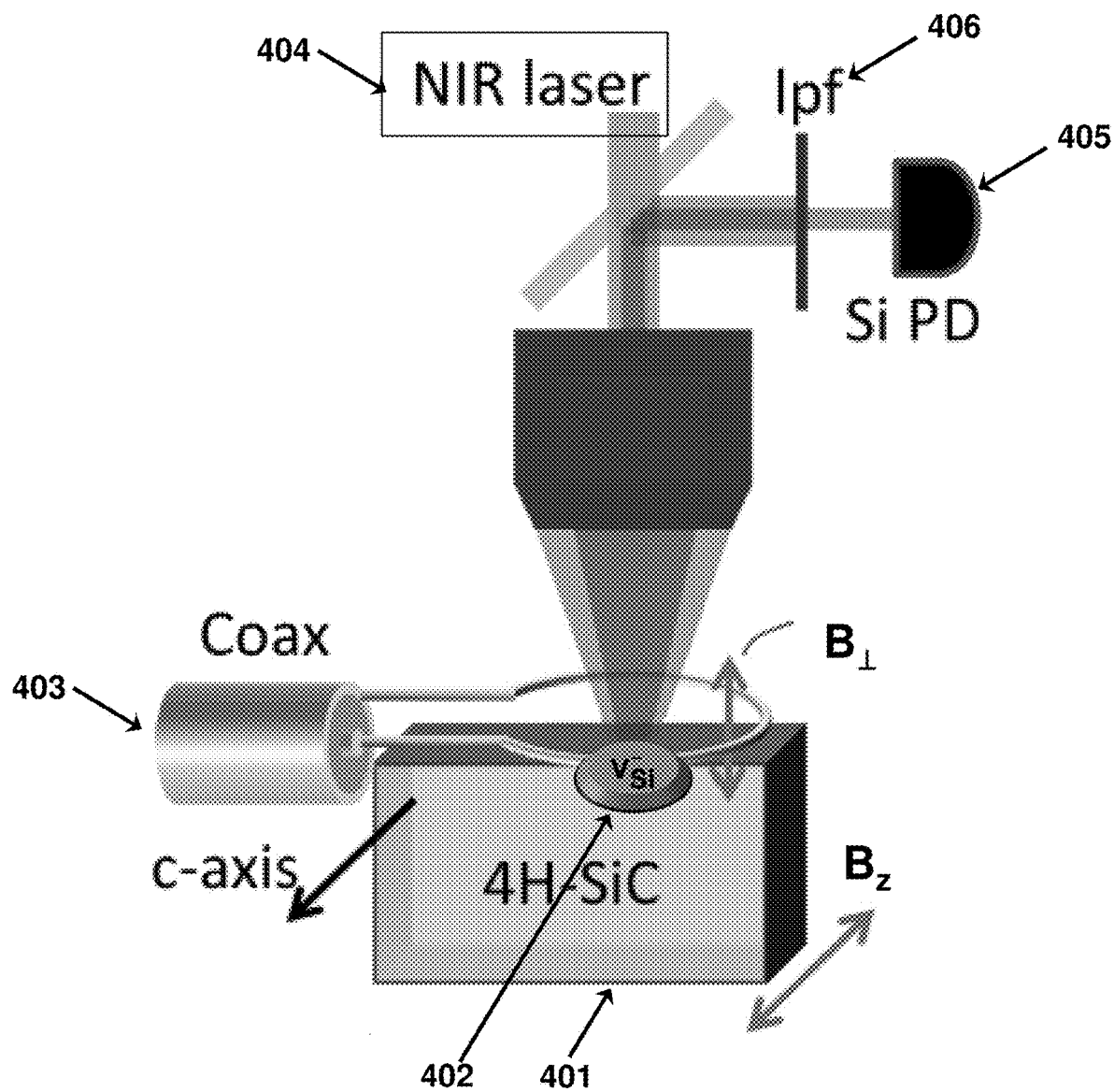

FIG. 4A is a block diagram illustrating exemplary components that can comprise a magnetic field sensor in accordance with the present invention. As illustrated in FIG. 4A, such a magnetic field sensor can include a SiC probe such as 4H-SiC probe 401 shown in FIG. 4A that contains one or more $V_{\overline{Si}}$ defects 402 and a coaxial cable 403 configured to apply a very slowly oscillating magnetic field $B_\perp$ to the sensor. As described in more detail below, the sensor is interrogated by one or more laser pulses, e.g., from near-infrared (NIR) laser 404, to produce a PL output that is measured by Si photodetector 405 so as to detect a magnetic field $B_m$ along the c-axis of the sample.

To make the sensor, additional spin 3/2 defects can be introduced into the sample beyond the native defects if necessary. For this, the sample (4H-SiC) is irradiated to create a desired density of $V_{\overline{Si}}$ defect centers. For example a typical electron irradiation with 2 MeV and a dose of $5 \times 10^{17}$ electrons/cm$^2$ can lead to a high density of defects. Proton, neutron, and any other similar irradiation techniques can also be used here to create defects. Different irradiation techniques will create various surrounding impurities around the defect that may improve the operation of the sensor. In order to remove contaminations on the surface, additional techniques such as acetone in an ultrasonic bath can also be used. Note that in a preliminary sample preparation step, isotopic purification of the sample may also be necessary to reduce the harmful effects of nuclear impurities nearby the defect.

The sample with the $V_{\overline{Si}}$ defect(s) is mounted on a sample holder. For low temperature sensor operation, the sample can be additionally placed in any cooling apparatus such as a closed-cycle cryostat to operate at roughly a few degrees Kelvin.

In a first step for detecting a magnetic field in accordance with the present invention, a static magnetic field $B_z \approx 1.25$ mT is switched on and kept on to bring/keep the system near the lower avoided crossing (ACL) in a manner similar to that described above with respect to FIG. 3B. The static magnetic field $B_z$ can be applied by any suitable mechanism, for example, by a permanent magnet or by a Helmholtz coil such as Coax 404 shown in FIG. 4A.

The value of the required $B_z$ originates from the g-factor of the defect GS, and therefore it can be different for different type of defects. It may also slightly differ from its native value for a given defect because of the various different environmental factors and their effects on the electronic structure, e.g. strain, electric fields, temperature, etc. Therefore, a calibration of the sensor will often be necessary as part of the third step in order to determine the precise $B_z$ value needed for a given sample to bring/keep the system near the lower avoided crossing (ACL). For this purpose, any technique that can reveal the energy spectra of the GS with respect to applied magnetic fields can be used. A few of such commonly used techniques are electron paramagnetic resonance (EPR), electron spin resonance (ESR), or optically detected magnetic resonance (ODMR), but any suitable technique can be used.

During both continuous wave (CW) and pulsed ODMR calibration techniques, or the resonant optical excitation, one can also send another higher energy re-pumping laser (e.g. 660 nm), off-resonant to the ZPL of the excited state, into the sample. Re-pumping increases the total PL intensity in the phonon side band. However, the ODMR contrast may be independent of the use of the additional off-resonant laser.

In a second step, as part of the sensor initialization stage, the optical excitation and resulting spin-polarization of the defect is implemented. In a sensor embodiment such as is illustrated in FIG. 4A, this initialization step, including the optical excitation from GS to ES 202 or ES 203, can be achieved by pulses from a laser such as NIR laser 404, and may be performed either resonantly or off-resonantly. For instance, for $V_1$ type (k-site) and $V_2$ type (h-site) $V_{\overline{Si}}$ defects in 4H-SiC, this can be done by excitation with a standard near infrared laser of wavelength between 700 nm-900 nm (near IR) for $V_2$ vacancy defects. For example, resonant optical excitation of a $V_1$ type (k-site) $V_{\overline{Si}}$ defect in 4H-SiC can be achieved by a 858/861 nm laser diode, such as by using a Littrow external cavity (900 µW on the sample, 300 GHz linewidth). For an off-resonant excitation of a $V_1$ type (k-site) $V_{\overline{Si}}$ defect, any appropriate higher energy laser can be used, for instance a 730 nm laser diode (usually 500 µW on the sample, or being varied from 0 to 500 µW for the optical saturation). The laser light can also be focused on the sample in a desired spot size by various optical apparatuses, for instance by a high numerical aperture (NA, e.g. 0.9) air objective. The same optical apparatus can also be used to collect back the photoluminescence (PL) from the defect.

As described above with respect to FIGS. 2A and 2B, while the optical emissions from ES 202 and ES 203 to GS have the same transition rates for spin $m_s=\pm 3/2$ and $m_s \pm 1/2$ states, the ISC mechanism will favor the $m_s=\pm 3/2$ state. Therefore, after few cycles of optical excitation by a laser, the $V_{\overline{Si}}$ defect will be spin-polarized into the $m_s=\pm 3/2$ state, meaning its $m_s=\pm 3/2$ states will become the primarily populated spin states. Although different defects and different materials may lead to the polarization of different spin states, such as $m_s=\pm 1/2$, the essentials of the sensing scheme used in this invention will be still applicable.

Note that the first and second steps may be performed in the opposite order, as the system may instead be brought into and kept in the ACL regime after the optical initialization (spin-polarization) is achieved.

At the end of the initialization stage, where the defect is maximally spin-polarized, a PL signal will saturate to a fixed value. The PL signal will be received by Si PD 405 and recorded as $PL_{init}$ for use in determining the measured field strength.

FIGS. 4B and 4C illustrate aspects of a Ramsey pulse sequence used to detect an external DC magnetic field $B_m$ having a component along the c-axis, using a SiC crystal having a 3/2 spin $V_{\overline{Si}}$ monovacancy in accordance with the present invention.

Thus, in a third step of a method for detecting a DC magnetic field in accordance with the present invention, after the sensor is initialized (i.e., spin-polarized), a first static $B_\perp$ pulse 410 orthogonal to the c-axis of the sample is applied for the duration of $\pi/2$ rotation to bring the $m_s=+3/2$ states (that are now spin-polarized) into a linear superposition of $m_s=+3/2$ and $m_s=-1/2$ states. Note that a full $2\pi$ pulse corresponds to the case where the initial spin state is rotated back on to itself which may be illustrated intuitively on a Bloch sphere shown in FIG. 4C. This spin state rotation time is inversely proportional with the applied pulse strength. In an exemplary case, the strength of the $B_\perp$ pulse is 30 µT, but any pulse strength can be used as long as the final combined duration of all the initialization, pulsing, and measurement times do not exceed the given defect's decoherence times.

The pulses can be applied by any standard static sources, such as Coax 403 shown in FIG. 4A, but can also be applied by permanent magnets, Helmholtz coils, etc., placed on translation/rotational stages near the defect inside or outside of any cooling or holding apparatus. These pulses can also be applied by very slowly varying radiofrequency (RF) or microwave (MW) fields as long as the sensor is calibrated properly to give a proper $\pi/2$ rotation of the initial $m_s=\pm 3/2$ spin state. This calibration can be done by standard techniques such as EPR, ESR, and ODMR. For instance, these slowly varying fields can be created by a vector signal generator, amplified by an amplifier and can be delivered by a conducting wire (e.g. with a diameter of 10-100 µm), which can be spanned on the sample surface. For the creation of RF pulses, a RF switch controlled by a pulse generator (e.g. FPGA-based) can be used.

In addition, the external magnetic field $B_m$, which has a component along the c-axis of the sample, will cause the superposition state constructed in the previous step as described above to freely evolve (precesses) along the c-axis. Due to different spin multiplicities of $m_s=+3/2$ and $m_s=-1/2$, differing by $\Delta m_s=\pm 2$, an accumulation of a phase difference $\phi(\tau)=\int_0^\tau B_m \, dt$ between the $m_s=+3/2$ and $m_s=-1/2$ components of this superposition state will occur over an interrogation time $\tau$. The superposition state under the effect of the measured field becomes $|3/2\rangle + e^{i2\Phi(\tau)}|-1/2\rangle$ and can be illustrated as a rotating state along the equator of the Bloch sphere shown in FIG. 4C during the interrogation time $\tau$.

In the next step, a second $\pi/2$ $B_\perp$ pulse 420 is applied after the interrogation time $\tau$. Because the defect has previously been properly initialized (spin-polarized), where only $m_s=+3/2$ states are initially populated, the last pulse redistributes this population over both $m_s=+3/2$ and $m_s=-1/2$ states to convert the overall phase difference induced between the components of the superposition state into a population difference between the $m_s=+3/2$ and $m_s=-1/2$ states.

In a final step, the read-out of this new population distribution can be performed by another optical excitation of the defect, e.g., by NIR laser 404. As described above with respect to FIG. 2A, due to the involvement of the spin-selective ISC mechanisms, the $m_s=+3/2$ and $m_s=-1/2$ states have different transition rates and therefore have different PL intensities. Scattered laser light can be filtered out using a long-pass filter (shown as lpf 406 in FIG. 4A) having a proper cutoff, e.g. 1340 or 1385 meV, such that PL from the phonon sidebands are collected and sent to a detector. The detector can be any of the near infrared enhanced APDs, for instance a Si photodiode such as Si PD 405 shown in FIG. 4A, or can be any other type of photon detector having proper wavelength sensitivity and resolution. The photoluminescence read-out signal $PL_{out}$ received by the photodetector is then recorded.

The sensor signal is defined as $1-((PL_{out}-PL_{init})/PL_{init})$ in terms of the recorded initialization and read-out PL intensities and represents the magnetic field $B_m$ along the c-axis of the sample. Thus, in the final step, $1-((PL_{out}-PL_{init})/PL_{init})$ is calculated, e.g., by a processor coupled to the photodetector or otherwise, and, using any suitable analytical technique known in the art, the magnetic field $B_m$ to be detected is determined by analyzing the difference between the thus-found $PL_{out}$ (resulting from $B_z$ and $B_m$) and the initial $PL_{init}$ (resulting from $B_z$ only).

The plots in FIG. 4D show the oscillations of the change in PL signal amplitude ($\Delta PL$) for a range of DC target fields that were found using a magnetic field detector in accordance with the present invention. Weaker measured DC magnetic fields lead to slower oscillations (longer periods) in the sensor signal. Therefore, keeping the interrogation time $\tau$ fixed (without exceeding the defect's decoherence times) for all sensor operations will lead to different signal values for different magnetic fields. Proper calibration of the sensor can be done by determining the bias signal values for known magnetic fields.

The direction of the magnetic field $B_m$ can also be obtained by various methods, such as rotating the c-axis of the sample during a continuous measurement cycle of the sensor. When $B_m$ is parallel to the c-axis, the sensor signal will be maximized.

In addition, although longer interrogation times (up to an optimal T where $\phi(\tau)$ reaches to $\pi$) improve the signal and signal-to-noise ratio for detection of smaller fields, the length of the interrogation times will be limited by the effective $T_2^*$ transverse relaxation times of the defect because each measurement done by the sensor has to be completed in a timescale shorter than the decoherence time of the defect. Early measurements on single Si vacancy defects in SiC (or 4H-SiC) report a lower bound of 160 μs for $T_2$ times as well as $T_2^*$ in the range of 10-50 microseconds. Various decoupling techniques, such as Carr-Purcell pulse sequences, can be used to improve these coherence times, therefore the minimum detectable fields. Moreover, these measurements can be repeated many times for signal averaging purposes and to get appreciable photon counts.

We note that the spin-3/2 defect is especially desirable for relaxation-based coherent detection techniques, i.e. $T_1$-NMR, as a result of the reduced nuclear spin mixing effects in the ACL regime. See J.-P. Tetienne et al., "Spin relaxometry of single nitrogen-vacancy defects in diamond nanocrystals for magnetic noise sensing," *Phys. Rev. B* 87, 235436 (2013).

In any usual $\Delta m_s=\pm 1$ avoided crossing with other conventional defects, the electron Zeeman energy becomes comparable to the hyperfine coupling ($S\overline{A}I$), and the electron spin S acquires decoherence due a nearby nuclear spin I by the non-secular processes, i.e., $S_x I_x$ and $S_y I_y$, significantly reducing the decoherence times, and thereby limiting the sensor sensitivity. See V. Jacques et al., "Dynamic Polarization of Single Nuclear Spins by Optical Pumping of Nitrogen-Vacancy Color Centers in Diamond at Room Temperature," *Phys. Rev. Lett.* 102, 057403 (2009). However, the avoided crossing (ACL) utilized in the present invention for magnetic field sensing occurs between $m_s=+3/2$ and $m_s=+1/2$ states, which differ by $\Delta m_s=\pm 2$. The non-secular processes still involve the out-of-phase auxiliary state $m_s=1/2$ with larger electron Zeeman splitting, and so will have a much smaller probability. As a result, such non-secular processes will not affect the interrogation times $\tau$ in the present invention significantly because of this double resonance nature of the ACL in which at least two simultaneous nuclear spin flips are needed to change the electron spin by $\Delta m_s=\pm 2$.

In other aspects, the present invention provides a sensing scheme for the detection of an AC, i.e., oscillating, magnetic field.

Figure 5A:
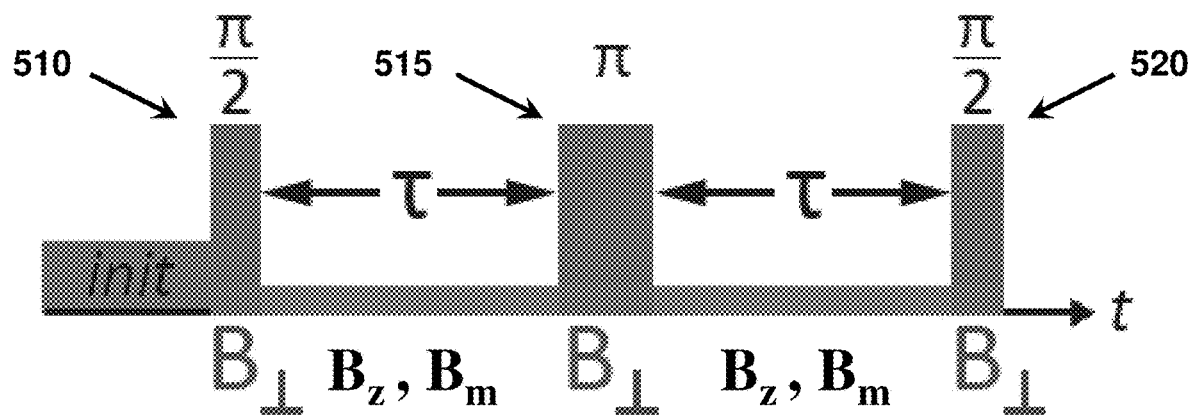
FIGS. 5A-5B illustrate aspects of AC magnetic field detection using a $V_{\overline{Si}}$ monovacancy defect in 4H-SiC in accordance with the present disclosure.
Figure 5B:
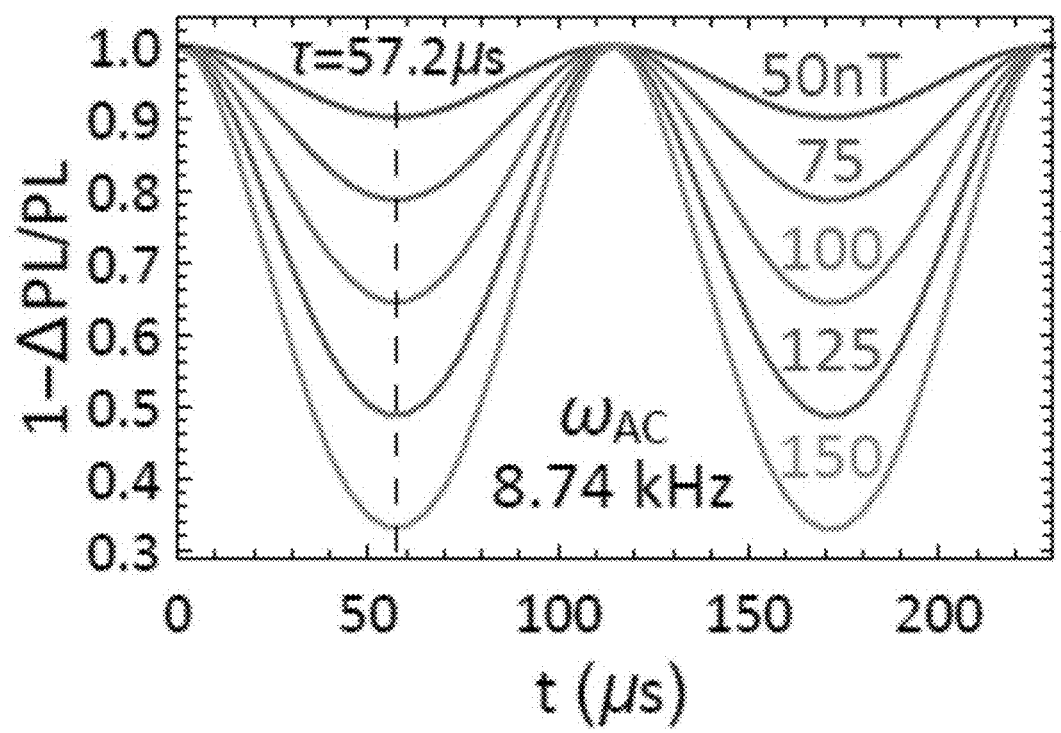

FIGS. 5A and 5B illustrate aspects of an AC magnetic field sensing scheme that incorporates a SiC spin-3/2 $V_{\overline{Si}}$ monovacancy defect in accordance with the present invention.

As with the DC magnetic field sensor described above, an AC magnetic field sensor in accordance with one or more aspects of the present invention uses the identification of the ACL point described above along with a Can-Purcell and/or Hahn-echo type magnetic field sensing scheme known the art, see E. L. Hahn, "Spin Echoes," *Phys. Rev. B*, 80, 580 (1950), to detect a small oscillating target magnetic field $B_z$.

In accordance with the present invention, an AC magnetic field can be detected using an apparatus such as that described above with respect to FIG. 4A. In addition, in a method for detecting an AC magnetic field in accordance with the present invention, all of the steps for sensing a DC magnetic field are followed, except with an introduction of additional pulse sequences as now described.

Thus, as shown in FIG. 5A, to increase the AC magnetic field sensitivity of the sensor, an additional $\tau$-pulse 515 is applied at time $\tau/2$ between the $\pi/2$ initialization and $\pi/2$ read-out pulses 510 and 520. This additional pulse 515 reduces the dephasing of the GS spins of the sensor and increases the transverse relaxation time from $T_2^*$ to a longer $T_2$ time. This increases the AC field sensitivity of the sensor significantly by allowing for longer interrogation time $\tau$.

The plots in FIG. 5B show simulated signals from several exemplary AC magnetic fields all with the same frequency.

This frequency was chosen to achieve reasonable echo times ($2\tau$) smaller than transverse relaxation time $T_2$. The AC magnetic sensitivity is given by $\zeta_B=\sigma_0/(\sqrt{N}dSdB)$ where $S\propto\cos^2[2\phi(\tau)]$ is the defect-specific signal, $\sigma_0$ is the standard deviation per measurement and $N=T/\tau$ is the number of measurements in a one-second averaging time T. See Thomas Wolf et al., "Subpicotesla Diamond Magnetometry," *Phys. Rev. X* 5, 041001 (2015). The maximum contrast between the $\underline{m}_s=\pm 3/2$ and $m_s=\pm 1/2$ states is taken to be about one percent of the total average PL photon count of 40 Kcps from the defect with a solid immersion lens. See Widmann, supra. In an exemplary case, the magnetic field response dS/dB was constructed from the spin echo AC field data for $\tau=114$ μs. See Supplementary Material, supra. This gives a shot-noise limited magnetic sensitivity of $\zeta_B=40$ nT $HZ^{-1/2}$ for an AC field with frequency $\omega_{AC}=4.4$ kHz. Although decreasing AC frequency increases the overall sensitivity, such an increase in sensitivity will be limited by the $T_2$ relaxation time.

In some embodiments, instead of a Hahn echo pulse sequence, a Carr-Purcell-Meiboom-Gill (CPMG) type pulse-echo sequence, with or without additional phases, such as XYN or YYN, can be used to apply the $B_1$ magnetic field pulses. Theoretically an appropriate CPMG type pulse sequence can boost the coherence times up to the $T_1\approx 340$-500 μs longitudinal relaxation times of the $V_{\overline{Si}}$ defect, thus permitting longer interrogation times. See Widmann, supra; see also Simin, supra. Therefore, sensitivities of less than nT $Hz^{-1/2}$ should be achievable with single $V_{\overline{Si}}$ defect centers after optimizations involving isotopic purification and implementation optical wave-guiding to increase the photon collection efficiency. To obtain better spectral resolution, one could use a spin-locking scheme. See M. Loretz et al., "Radio-Frequency Magnetometry Using a Single Electron Spin," *Phys. Rev. Lett.* 110, 017602 (2013).

Figure 6A:
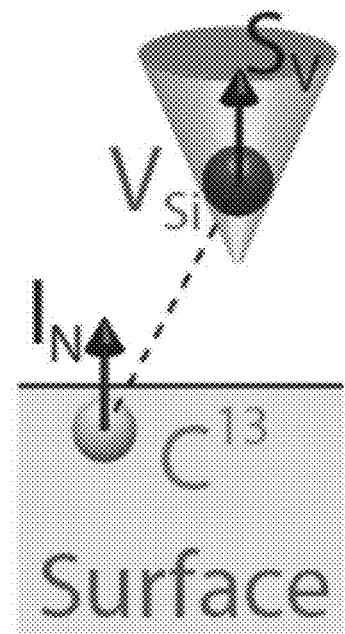
FIGS. 6A and 6B further illustrate aspects of magnetic field sensing using a sensor that incorporates a $V_{\overline{Si}}$ defect in 4H-SiC in accordance with the present invention.
Figure 6B:
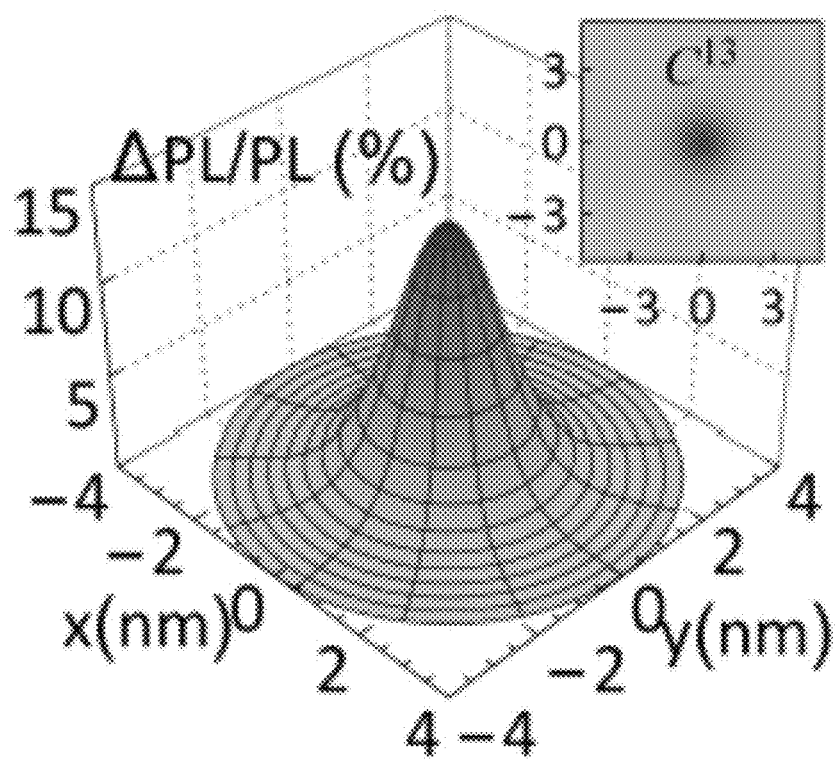

FIGS. 6A and 6B further illustrate aspects of magnetic field sensing using a sensor that incorporates a $V_{\overline{Si}}$ defect in 4H-SiC in accordance with the present invention.

As illustrated in the schematic shown in FIG. 6A, a magnetic field scan of a carbon surface can be made using an oscillating SiC atomic-force microscopy (AFM) tip containing a single $V_{\overline{Si}}$ defect. In an exemplary simulated case illustrated in FIG. 6A, the tip is kept at a height h of 3 nm from a surface that contains a single nuclear isotope $C^{13}$, and isotope whose magnetic moment is roughly $2.6 \times 10^3$ times smaller than the magnetic moment of an electron.

The probe tip is then optically stimulated to produce a photoluminescent emission. PL measurement shots are taken with an interrogation time of $\tau=801$ μs in a 500×500 grid to produce an image of a single $C^{13}$ nuclear magnetic moment shown in FIG. 6B.

In some embodiments, a $V_{\overline{Si}}$ defect-based sensor in accordance with the present invention can also be used in surface nuclear magnetic resonance (NMR) for detection or imaging purposes. In other embodiments, a single sensor or an ensemble of $V_{\overline{Si}}$ sensors formed near the surface of a substrate or a SiC sample can be used to detect molecules such as proteins that are placed within a solution such as oil or gel on the surface.

The present invention also provides a device and method for sensing a strain in a physical system. This is particularly important because any mechanical force, such as those associated with acceleration, rotation, weight, gravitation, etc., exerted on to a physical system will induce additional strain and stress within the structure of the system. The detection of this strain/stress leads to the identification of the force exerted upon the system. Moreover, the present invention provides for extraordinary sensitivities and spatial resolution by detecting very small strains in the atomic scale. Therefore, it can be utilized for navigation, gravimetry, geodesy, and biochemical sensing with extraordinary sensitivity and spatial resolution.

Figure 7A:
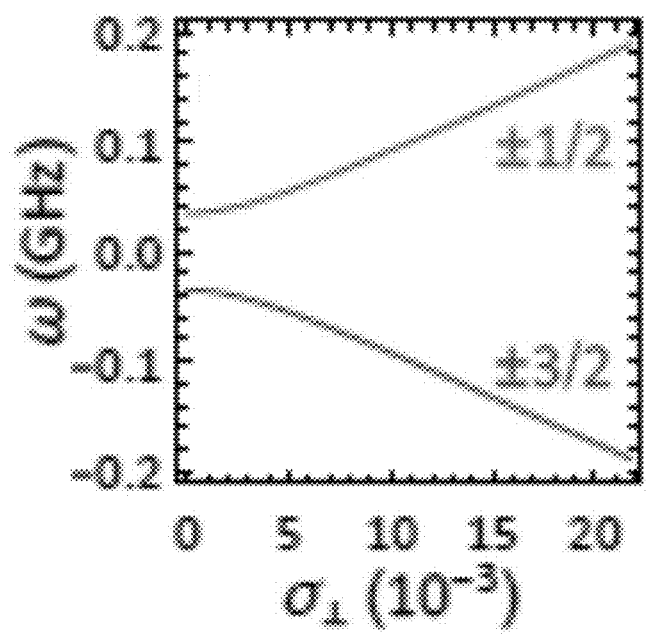
FIGS. 7A and 7B illustrate aspects of strain sensing using a sensor that incorporates a $V_{\overline{Si}}$ defect in 4H-SiC in accordance with the present invention.
Figure 7B:
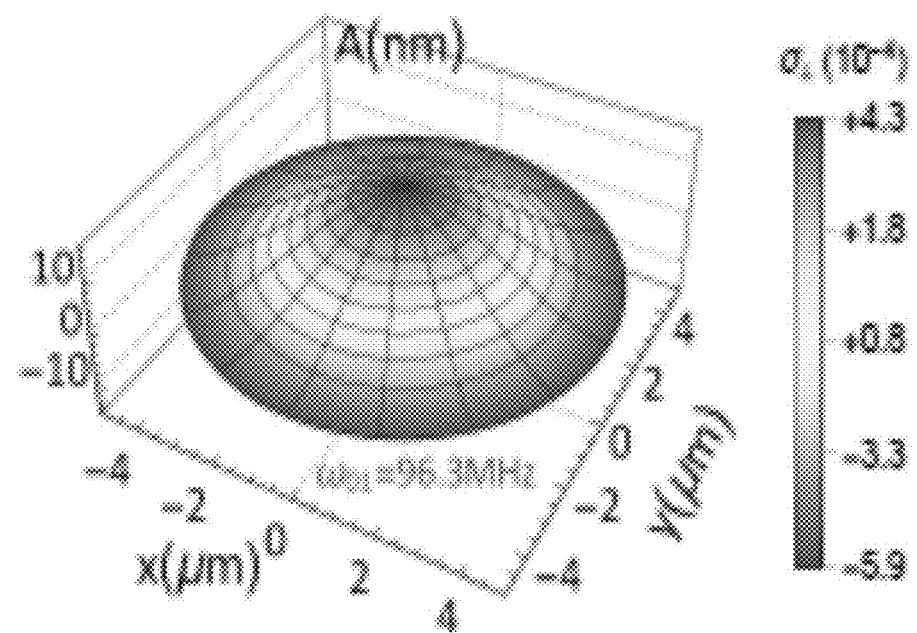

FIGS. 7A and 7B illustrate aspects of strain sensing using a SiC sensor having a $V_{\overline{Si}}$ defect in accordance with the present invention.

A sensor in accordance with this aspect of the present invention utilizes a hybrid quantum system comprising a single $V_{\overline{Si}}$ defect and a typical micro-mechanical resonator. In an exemplary embodiment, a strain sensor in accordance with one or more aspects of the present invention includes a mechanical resonator in the form of a 4H-SiC thin film membrane containing a spin-3/2 $V_{\overline{Si}}$ defect. To maximize the strain coupling, the sensor can be configured so that the $V_{\overline{Si}}$ defect is situated near the surface of and at the center of the membrane where the fundamental acoustic mode of the membrane attains a maximum value of the strain at the defect location. It could be placed at the edge of the membrane where the strain of the fundamental mode has another local extreme. The strain sensitivity of the quantum $V_{\overline{Si}}$ strain sensor is estimated using the typical elastic parameters of the material known in the art, and spin-strain coupling Hamiltonian of the defect. Such mechanical resonators and accurate defect placement has been already demonstrated by using various masked irradiation and smart-cut techniques. See Maboudian, supra.

The $V_{\overline{Si}}$ defect can be placed near the surface of the resonator and can be used to detect any strain/stress induced in the structure due to external forces. These resonator structures can be manufactured from SiC itself and can be irradiated to create $V_{\overline{Si}}$ defects in them by any irradiation techniques, such as electron, proton, or neutron irradiation. These resonators can also be manufactured from any other semiconductor material that can be used as a substrate or a host layer for the SiC. In such cases, the material chosen should allow for a sufficient strain translation into the SiC layer that is placed on the structure and contains the $V_{\overline{Si}}$ defects. These structures can be also manufactured in many different shapes in order to maximize the strain induced in the structure when exposed to a given force. For example, zipper resonators, phononic crystals, tuning fork structures, variously shaped membranes, etc. can provide for optimized strain responses, though other structures may be employed as appropriate. The sizes or shapes of these structures can also be engineered to optimize the coupling of the strain modes, fundamental or higher lying modes, to the defects used.

As an initial step in a method for detecting strain using a $V_{\overline{Si}}$ defect sensor in accordance with the present invention, the structure is calibrated by measuring the initial ZFS of the defect GS. This calibration can be accomplished using any suitable technique that can reveal the spin-3/2 structure of the GS, such as EPR, ESR, and ODMR techniques known in the art.

In a typical calibration using ODMR and using $V_{\overline{Si}}$ defects, the defect is continually or in pulsed manner excited from GS to any of the optically active excited states ES 202 and ES 203 described above by means of a laser emitting at a suitable wavelength, either on or off-resonantly. For example, the excitation laser for ODMR can be a tunable Ti:Sapphire laser that is focused onto the sample with a high numerical aperture (e.g. 0.9) 50× objective that also collects PL from the defect. Scattered laser light can be filtered out using a long-pass filter (with a proper cutoff, e.g. 1340 or 1385 meV), such that PL from the phonon sidebands are collected and sent to a detector such as a Si photodiode. This allows the defect to become spin-polarized (primarily populating either the $m_s=\pm 3/2$ or $m_s=\pm 1/2$ state) and a steady-state PL signal is observed. At the same time, a varying frequency RF/MW field is scanned in the frequency scale of the GS ZFS. A RF/MW magnetic field can be produced by a number of different ways, for example, shorting the inner conductor of a coax line to the outer conductor with a 10-50 μm diameter gold wire formed into a loop surrounding the laser excitation spot. When the RF/MW field becomes resonant with the transitions between the $m_s=\pm 3/2$ or $m_s=\pm 1/2$ spin states of the defect GS, a maximum change in PL can be observed due to the population redistribution induced by the RF/MW field between the $m_s=\pm 3/2$ or $m_s=\pm 1/2$ states. This frequency can be recorded as the $PL_{init}$ and can be deemed to be equal to the ZFS energy of the GS.

In accordance with the present invention, the varying (oscillating) flexural strain produced during oscillation of the membrane induced by an external force can be detected by measuring the variations in the ZFS of the $V_{\overline{Si}}$ defect, where the changes in this ZFS can be detected by any technique that can reveal the GS ZFS of the defect, such as EPR, ESR, and ODMR methods known in the art. See Supplementary Material, supra.

The change in ZFS (increase or decrease depending on the defect) with respect to strain can be non-linear. This means that in a certain range of strain values, the ZFS response to strain changes can increase appreciably, therefore increasing the overall sensitivity of the defect sensor to changes in strain. In such cases, a fixed bias strain field can be applied to the micro-mechanical resonator prior to the calibration and during the measurement in order to keep the defect in this strain range.

In the next step in a method for strain detection using a $V_{\overline{Si}}$ sensor in accordance with the present invention, the sensor is exposed to the strain to be detected. This strain can be due to a force such as translational or rotational acceleration, weight of a molecule on the surface of the resonator, or gravitation, etc. which induces an additional strain/stress within the structure as well as causing an acoustic oscillation of the structure. The oscillation induced can be a combination of all acoustic modes of the resonator; however the location of the defect can be chosen in a way to optimize its coupling to a chosen mode of the resonator. Structural engineering of the micro-resonator with varying shapes, sizes, etc. can also be used to increase the contribution of a chosen mode among others. The oscillations induced by the force will cause oscillating strain at the defect location causing the GS ZFS to periodically change during this strain.

In a third step, during the induced oscillations of the structure due to the measured force, the ODMR measurement of the GS ZFS is repeated and the new RF/MW frequency that corresponds to the absolute maximum PL is recorded as $PL_{out}$. The plot in FIG. 7A shows the simulated change in the ZFS ($\Delta D$) of the ground state versus an in-plane (flexural) strain $\sigma_\perp$ on the membrane. Continuous read-out of $PL_{out}$ for more than one cycle of the acoustic oscillations can be also be used to determine the dampening rate of the micro-resonator. This dampening rate can also be used to determine the directional properties of the force as well as the environmental factors.

In the final step, the difference $PL_{out}-PL_{init}$ is calculated to determine the overall change in ZFS energy with respect to the exerted force. This change in ZFS energy can be now be converted into an expression of force using any suitable method, such as use of calibration/reference tables of the sensor produced empirically from previously known forces, and so can be used in the determination of the strength of the unknown force on the sample. The strength of the force can also be determined by converting the ZFS change into strain using a ZFS frequency-strain response table known in the art, and then converting this strain into an expression of force using the known art elastic properties of the material used in the micro-mechanical resonator.

FIG. 7B illustrates how measurement of the variations in the ZFS can correlate to variations in strain exhibited by the membrane. As shown in FIG. 7B, for an SiC membrane having an oscillation frequency $\omega=96.3$ MHz and an oscillation amplitude $|A|\approx15$ nm, the maximum surface flexural strain am along the defect's c-axis for the fundamental mode has a local spatial maximum flexural strain $\sigma_m=4.34\times10^{-4}$ at the $V_{\overline{Si}}$ defect site (center of the membrane).

As described above, the oscillations in the membrane produced by the external force $F_m$ cause oscillations in the local strain at the defect location and, therefore, oscillations in the ZFS of the defect which in return can be detected by ODMR. For simulated oscillations having a maximum flexural strain of $\sigma_m=4.34\times10^{-4}$, a $\Delta D=6.87$ MHz increase in the GS ZFS is shown. This value of $\Delta D$ is calculated in the presence of a larger and fixed bias strain $\sigma_0=10^{-2}$ where the defect response is most sensitive to very small changes in strain. In the presence of this bias strain, we calculate the strain sensitivity to be $\zeta_\sigma=h_n(\omega)\omega^{-1/2}\approx6.7\times10^{-8}$ strain/$\sqrt{Hz}$ using the typical reported noise amplitude in an experimental ODMR linewidth. This corresponds to the minimum observable strain during one second signal averaging in a typical ODMR measurement. Any smaller strain than this value will be undetectable because of reduced signal-to-noise ratios, approaching 1. However, different optimization and dynamical decoupling methods can be applied to reduce the ODMR linewidth and increase the signal-to-noise ratios; for instance, but not limited to, double resonance or any type of CPMG pulse sequences, improvements in the photoluminescence photon collection, improvements in the optical excitation cycle of these defects, temperature optimizations, laser polarization optimizations, isotropic purification of the host material, etc.

A strain detector which uses the spin-3/2 $V_{\overline{Si}}$ defect in accordance with the present invention is advantageous over those in the prior art in that it provides roughly two orders of magnitude improvement in sensitivity over spin-1 defects (see, e.g., Preeti Ovartchaiyapong et al., "Dynamic strain-mediated coupling of a single diamond spin to a mechanical resonator," Nat. Commun. 5, 4429 (2014)) due to the near $T_d$ local symmetry and Kramer's degeneracy. In addition, it utilizes simpler spin resonance detection techniques, such as ODMR, EPR, or ESR, without requiring any dynamical decoupling sequences to exceed the sensitivity of those in the prior art. This makes the spin-3/2 defects technologically appealing for hybrid quantum systems in realistic applications, e.g. navigation, gravimetry, and autonomous detection systems.

In addition, the ground state zero-field splitting (GS-ZFS) of the spin-3/2 $V_{\overline{Si}}$ defect in SiC is highly sensitive to temperature, and consequently, a $V_{\overline{Si}}$ defect-based sensor in accordance with the present invention can also be used as a temperature sensor. The use of a $V_{\overline{Si}}$ defect-based sensor provides a unique opportunity for applications such as nano bio-chemical sensing with the combined benefit of increased optical penetration capabilities due to the $V_{\overline{Si}}$ zero-phonon line that lies in the near-infrared window of biological tissue. See Andrew M. Smith et al., "Bioimaging: Second window for in vivo imaging," Nature Nanotechnology 4, 710-711 (2009).

For the temperature dependence of the GS, the inventors obtained a simple analytical expression showing a dD/dT=1 kHz/K change in ZFS around T=300K, see Supplementary Material, supra, which is in agreement with recent experiments. See, e.g., H. Kraus et al., "Magnetic field and temperature sensing with atomic-scale spin defects in silicon carbide," Sci. Rep. 4, 5303 (2014). This expression corresponds to a fractional thermal response of dD/(DdT)=−1.4× $10^{-5}$ K$^{-1}$ and is an order of magnitude higher than that for NV-centers in diamond, see V. M. Acosta et al., "Temperature Dependence of the Nitrogen-Vacancy Magnetic Resonance in Diamond" Phys. Rev. Lett. 104, 070801 (2010), due to the near $T_d$ symmetry.

Thermal expansion of the SiC crystal changes the distances and bonding angles between the neighboring carbon atoms around the defect (see FIG. 1). The ground state ZFS is determined mostly by the dipolar spin-spin interactions between the defect's active electrons. The dipolar coupling results from each spin generating a magnetic field that is oriented parallel to the electron spin vector. Two spins located around the vacancy experience each other's magnetic field that depends on the orientation of both magnetic dipoles. The dipole-dipole coupling strength depends strongly on the spin-spin distance $1/r^3$ and on the dipolar angle θ between the axis connecting the two spins and the c-axis of the defect. Therefore, the thermal expansion of the lattice around the defect leads to a change in the ZFS of the GS determined by the dipolar spin-spin interactions.

Thus, in accordance with the present invention, a sensor incorporating SiC having a $V_{\overline{Si}}$ monovacancy defect can be inserted into or placed near an object whose temperature is to be detected, either to detect its absolute temperature, to detect its temperature relative to another object, or to detect a change in its temperature by continuously measuring its ZFS.

The defect is created by standard irradiation techniques, such as electron, proton, or neutron irradiation, in a uniaxial SiC crystal with any desired shape and size. For the utilization of this sensor in biomedical sensing, smaller sized nano-scale structures containing a single defect or an ensemble of defects of any density can be preferred.

As an initial step in a method for detecting temperature using a $V_{\overline{Si}}$ defect sensor in accordance with the present invention, the sensor is calibrated by measuring the initial ZFS of the defect GS. This calibration can be accomplished using any suitable technique that can reveal the spin-3/2 structure of the GS, such as EPR, ESR, and ODMR techniques known in the art. In a typical calibration using ODMR and using $V_{\overline{Si}}$ defects, the defect is continually or in pulsed manner excited from GS to any of the optically active excited states ES 202 and ES 203 described above by means of a laser emitting at a suitable wavelength, either on or off-resonantly. This allows the defect to become spin-polarized (primarily populating either the $m_s=\pm 3/2$ or $m_s=\pm 1/2$ state) and a steady-state PL signal is observed. At the same time, a varying frequency RF/MW field is scanned in the frequency scale of the GS ZFS. When the RF/MW field becomes resonant with the transitions between the $m_s=\pm 3/2$ or $m_s=\pm 1/2$ spin states of the defect GS a maximum change in PL can be observed due to the population redistribution induced by the RF/MW field between the $m_s=\pm 3/2$ or $m_s=\pm 1/2$ states. This frequency can be recorded as the $PL_{init}$ and can be deemed to be equal to the ZFS energy of the GS for the temperature used in calibration.

In a second step of a method for detecting temperature using a sensor incorporating a $V_{\overline{Si}}$ defect in accordance with the present invention, the sensor is placed into an environment residing at a temperature to be measured and is allowed to reach a thermodynamical equilibrium with this environment. The new equilibrium temperature reached by the defect will cause a change in the local atomic structure (as an expansion or contraction) of the defect as described above. This change will affect the spin-spin interactions within the defect, therefore changing the GS ZFS.

Thus, in the next step, the new GS ZFS produced by the thermal expansion of the defect can be measured using the techniques described above with respect to the calibration step, and the new frequency can be recorded as the $PL_{out}$.

Finally, the difference $PL_{out}-PL_{init}$ can be calculated to determine the overall change in ZFS energy with respect to temperature change induced on the defect. This change can be now be converted using any calibration/reference tables of the sensor produced empirically from previously known temperatures. The temperature can also be determined by converting the ZFS change into temperature using the temperature dependent ZFS formulas obtained from the spin-spin interactions using the material's known thermal expansion coefficients, see Supplementary Material, supra.

A fully relativistic treatment of the electronic properties of the $V_{\overline{Si}}$ Si deep center defect in 4H-SiC has been used to develop opportunities for quantum metrology in this system. It has been shown that the novel features of half spin multiplet, i.e. class spin-3/2 quartet, defects allow for novel sensing schemes and easy-to-implement detection protocols with unique advantages that make possible sensitivities well beyond those of current technologies. Other point defects, i.e. 3d transition metal or rare-earth impurities in semiconductors, may also provide similar opportunities in quantum sensing due to their high half-spin (S≥3/2) configurations.

In other aspects, using the hyperfine coupling described above, the present invention provides a quantum memory based on nuclear spins.

Figure 8:
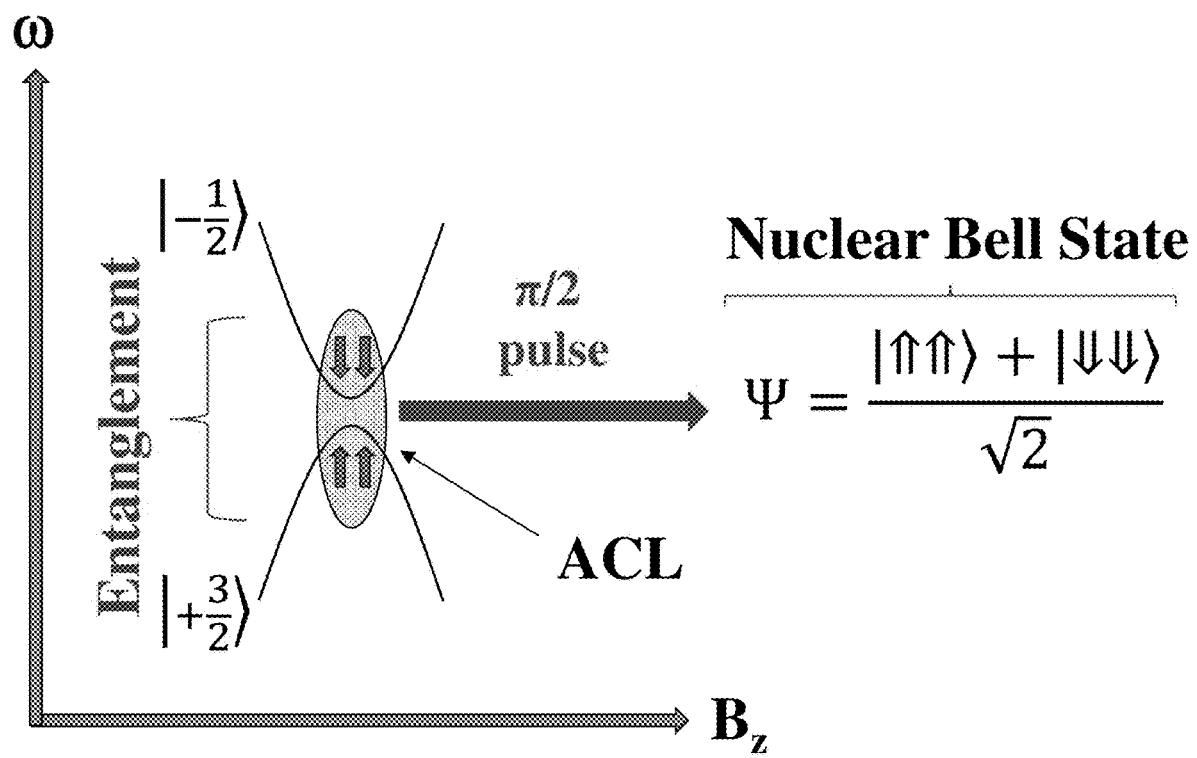
FIG. 8 illustrates the aspects of nuclear quantum memory using the avoided crossing (ACL) in accordance with the present invention.

FIG. 8 illustrates the aspects of nuclear quantum memory in accordance with the present invention using the avoided crossing (ACL or ACH) regime described above with respect to the DC and AC sensors.

At the avoided crossing (ACL) utilized in the present invention, the $m_s=+3/2$ and $m_s=-1/2$ states differ by $\Delta m_s=\pm 2$ while also involving an auxiliary $m_s=1/2$ state. In the case of nuclei I near the defect, the $V_{\overline{Si}}$ defect's electron spin will be coupled to each nuclear spin by the hyperfine coupling, given as $H_f=A_f(S_+I_-+S_-I_+)$, where $A_f$ is the hyperfine coupling strength and will depend on the distance between the nucleus and the defect, the operators $S_+$ and $I_+$ indicate a spin flop (an increase in $m_s$ value) for the electron and nucleus spins, respectively, and $S_-$ and $I_-$ correspond to a spin flip (a decrease in $m_s$ value). The result is that in the case of strong hyperfine coupling where a nucleus is near the defect, each defect electron flip will be accompanied by a nuclear spin flop (and vice versa) to conserve the overall energy of the coupled system.

A nuclear quantum memory in accordance with the present invention can be achieved using an apparatus such as that described above with respect to FIG. 4A.

In addition, the steps related to initialization of the defect and application of the π/2 pulses described above with respect to the method for detecting DC and AC magnetic fields also provide a nuclear quantum memory as will now be described.

Thus, a quantum memory device in accordance with the present invention can include a SiC sample having a spin-3/2 $V_{\overline{Si}}$ defect in the presence of nearby nuclei, a laser configured to optically excite and spin-polarize the defect, and one or more sources of a magnetic field pulse, in a configuration such as that shown in FIG. 4A described above.

As a first step in a method for creating nuclear quantum memory using such a device in accordance with this aspect of the present invention, as in the detection of magnetic fields described above, the SiC sample is subjected to a static magnetic field $B_z\approx 1.25$ mT to bring and keep the system into the ACL regime. In accordance with the present invention, ACH regime can also be used, either separately or in rotation with ACL, through an application of a proper ACH magnetic field $B_z\approx 2.5$ mT.

At the ACL and in the presence of two nearby nuclei, the spin-polarized defect GS is accompanied by two nuclear spins leading to an overall state of $|3/2; \Uparrow \Uparrow \rangle$ in which each nuclear spin having $m_I=+1/2$ or $m_I=-1/2$ are represented by an upward or a downward arrow, respectively.

As a second step in a method for creating nuclear quantum memory in accordance with the present invention, a π/2 magnetic field pulse $B_\perp$ in the basal plane of the defect is then applied in a manner similar to that described above with respect to DC magnetic field sensing. As illustrated in FIG. 8, this This pulse carries the spin-polarized $|3/2; \Uparrow \Uparrow \rangle$ defect state into a superposition state $[|3/2; \Uparrow \Uparrow \rangle +|-1/2; \Downarrow \Downarrow \rangle]/\sqrt{2}$. Thus, the nuclear spin state $[|\Uparrow \Uparrow \rangle +|\Downarrow \Downarrow \rangle]/\sqrt{2}$ known in the art as the "Nuclear Bell State" shown in FIG. 8 is achieved after the application of the π/2 magnetic field pulse $B_\perp$ to a SiC sample having a spin-3/2 spin-3/2 $V_{\overline{Si}}$ defect in accordance with the present invention.

This Bell State is the fundamental building block for a quantum memory due to its maximally entangled nature, and is also a crucial step in the achievement of quantum teleportation, also known in the art. The application of additional π/2 magnetic field pulses after the first pulse, with or without the utilization of ACH in addition to or in place of the ACL regime, can also be used for the creation of other maximally entangled nuclear states such as [|⇑ ⇑ ⟩ −| ⇓ ⇓ ⟩ ]/√2 and [|⇑ ⇓ ⟩ ±| ⇓ ⇑ ⟩ ]/√2, also known in the art as Bell states, that provide a complete orthonormal basis for a quantum memory.

In addition, due to highly correlated nature of electrons and nuclei at the ACL (or ACH) regime, application of a proper $B_\perp$ pulse in the ACL regime encodes (registers) any initial spin state information of the defect electrons, such as (|3/2⟩ +$e^{i\phi}$|−1/2⟩ )/√2), into nuclear spins, resulting in a nuclear spin state (|⇑ ⇑ ⟩ +$e^{i\phi}$| ⇓ ⇓ ⟩ )/√2).

As a third step in a method of creating nuclear quantum memory, a small $B_\phi$ magnetic pulse is applied along the c-axis of the defect. This $B_\phi$ pulse creates the information that can be encoded in the electron and nuclear spin states. The phase difference $\phi$ between $m_s$=3/2 and $m_s$=−1/2 can be continuously set to any value between 0 and 2π determined by the application time of the $B_\phi$ magnetic pulse. Therefore, infinitely many different form of information can be created using the $B_\phi$ pulse.

As a fourth step in a method of creating nuclear quantum memory in accordance with the present invention, the defect is brought out of the ACL, e.g., by changing the applied $B_z$ field away from the ACL field value of $B_z$=1.25 mT to some other appropriate $B_z$ field. Bringing the defect out of the ACL regime will prevent further interactions between the electron and nuclear spins and therefore will lock the nuclear spin-polarizations into their current state where the electron information is now stored, i.e., will write the information into nuclear memory. This process can be repeated to rewrite and/or overwrite the nuclear memory with new information as many times as needed.

As a final step in a method of creating nuclear quantum memory in accordance with the present invention, after the write operation, the information stored in the memory can be read-out, e.g., directly by using a standard nuclear magnetic resonance technique (NRM) known in the art, or indirectly through the electron spins.

To read out the information using the electron spins, the defect is optically spin-polarized into $m_s$=±3/2 spin states by an application of a proper wavelength laser and the resulting PL emission is recorded in a manner described above with respect to FIG. 4A. The system is then brought back into the ACL by application of a $B_z$≈1.25 mT magnetic field to enable the nuclear memory's interaction with the electron spins again. As a result of this interaction, the spin-polarization of the defect electrons will change and the initial $m_s$=+3/2 population will be redistributed between $m_s$=+3/2 and $m_s$=−1/2 states determined by the phase difference $\phi$. Due to the involvement of the spin-selective ISC mechanisms, the $m_s$=+3/2 and $m_s$=−1/2 states have different transition rates and therefore have different PL intensities. Scattered laser light can be filtered out using a long-pass filter such that PL from the phonon sidebands are collected and sent to a detector. The detector can be any of the near infrared enhanced APDs, for instance a Si photodiode such as Si PD 405 shown in FIG. 4A, or can be any other type of photon detector having proper wavelength sensitivity and resolution. The photoluminescence read-out signal $PL_{out}$ received by the photodetector is then recorded. $PL_{out}$−$PL_{init}$ is then calculated to obtain the phase information (1) initially stored in the nuclear memory.

This nuclear quantum memory can provide for a robust and stable quantum information storage due to its very long decoherence times reaching to minutes or hours, because the nuclear spins are naturally well isolated from the harmful effects of the environment due to their weak magnetic moments and Coulomb shielding effect of their electrons that surround them. Moreover, the method used to create complete set of nuclear Bell states is the key ingredient in quantum teleportation and super-dense coding which will also benefit from the nuclear spins' prolonged coherence times.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. An apparatus for measuring an external magnetic field $B_m$, comprising:
   a SiC sample having at least one spin-3/2 $V_{\overline{Si}}$ monovacancy defect therein;
   a first magnetic field source that applies a static magnetic field $B_z$ along a c-axis of the SiC sample;
   a laser that applies a first and a second set of laser pulses to the SiC sample;
   a second magnetic field source that applies first and second $B_\perp$ magnetic field pulses orthogonal to the c-axis of the SiC sample;
   a photodetector that receives first and second photoluminescence (PL) signals from the SiC sample; and
   a processor that receives data of the first and second PL signals from the photodetector and converts the PL signal data to an expression of the external magnetic field $B_m$;
   wherein the static magnetic field $B_z$ brings and keeps the SiC sample into an avoided crossing low (ACL) quantum state; and
   wherein the first set of laser pulses cause the $V_{\overline{Si}}$ defect to become spin-polarized to produce an initial population of $m_s$=±3/2 states, the first set of laser pulses also optically exciting the $m_s$=±3/2 states in the $V_{\overline{Si}}$ defect to produce a first PL signal $PL_{init}$ upon their relaxation to a ground state, the PL signal $PL_{init}$ being received by a photodetector;
   further producing a first PL signal $PL_{init}$ that is read by the photodetector;
   wherein the first $B_\perp$ pulse brings the spin-polarized $m_s$=±3/2 state of the $V_{\overline{Si}}$ defect into a linear superposition state of $m_s$=+3/2 and $m_s$=−1/2 states, the external magnetic field $B_m$ producing a phase difference $\phi(\tau)=\int_0^\tau B_m \, dt$ between the $m_s$=+3/2 and $m_s$=−1/2 components of the linear superposition state;
   wherein the second $B_\perp$ pulse redistributes the initial population of spin-polarized $m_s$=±3/2 states in the $V_{\overline{Si}}$ defect the over the $m_s$=+3/2 and $m_s$=−1/2 component states of the linear superposition state so as to convert the phase difference between the $m_s$=+3/2 and $m_s$=−1/2 components into a population difference between the $m_s$=+3/2 and $m_s$=−1/2 states;
   wherein the second set of laser pulses optically excite the $m_s$=+3/2 and $m_s$=−1/2 states in the $V_{\overline{Si}}$ defect and produce a second PL signal $PL_{out}$ upon their relaxation to a ground state, the PL signal $PL_{out}$ being received by a photodetector; and wherein the processor converts a difference $(1-(PL_{out}-PL_{init})/PL_{init})$ between the first and second PL signals into an expression of the external magnetic field $B_m$ incident on the sample.

2. A method for detecting an external DC magnetic field $B_m$, comprising:

provided a sample of SiC having at least one spin-3/2 $V_{\overline{Si}}$ monovacancy defect therein;

applying a static magnetic field $B_z$ along a c-axis of the SiC sample, the magnetic field $B_z$ bringing and keeping the SiC sample into an avoided crossing low (ACL) quantum state;

applying a first set of laser pulses to the SiC sample, the first set of laser pulses causing the $V_{\overline{Si}}$ defect to become spin-polarized to produce an initial population of $m_s=\pm 3/2$ states, the first set of laser pulses optically exciting the $m_s=\pm 3/2$ states in the $V_{\overline{Si}}$ defect and producing a first PL signal $PL_{init}$ upon their relaxation to a ground state, the PL signal $PL_{init}$ being received by a photodetector;

applying a first $B_\perp$ magnetic field pulse to the SiC sample, the first $B_\perp$ magnetic field pulse being orthogonal to the c-axis of the sample and bringing the spin-polarized $m_s=\pm 3/2$ state of the $V_{\overline{Si}}$ defect into a linear superposition state of $m_s=+3/2$ and $m_s=-1/2$ states, the external magnetic field $B_m$ producing a phase difference $\phi(\pi)=\int_0^\tau B_m\,dt$ between the $m_s=+3/2$ and $m_s=-1/2$ components of the linear superposition state;

applying a second $B_\perp$ pulse to the SiC sample, the second $B_\perp$ pulse being orthogonal to the c-axis of the sample and redistributing the initial population of spin-polarized $m_s=\pm 3/2$ states in the $V_{\overline{Si}}$ defect the over the $m_s=+3/2$ and $m_s=-1/2$ component states of the linear superposition state so as to convert the phase difference between the $m_s=+3/2$ and $m_s=-1/2$ components into a population difference between the $m_s=+3/2$ and $m_s=-1/2$ states;

applying a second set of laser pulses to the SiC sample, wherein the second set of laser pulses optically excite the $m_s=+3/2$ and $m_s=-1/2$ states in the $V_{\overline{Si}}$ defect and to produce a second PL signal $PL_{init}$ upon their relaxation to a ground state, the PL signal $PL_{out}$ being received by the photodetector; and converting a difference $(1-(PL_{out}-PL_{init})/PL_{init})$ between the first and second PL signals into an expression of the external magnetic field $B_m$ incident on the sample.

3. A method for detecting an external AC magnetic field $B_m$, comprising:

providing a sample of SiC having at least one spin-3/2 $V_{\overline{Si}}$ monovacancy defect therein;

applying a static magnetic field $B_z$ along a c-axis of the SiC sample, the magnetic field $B_z$ bringing and keeping the SiC sample into an avoided crossing low (ACL) quantum state;

applying a first set of laser pulses to the SiC sample, the first set of laser pulses causing the $V_{\overline{Si}}$ defect to become spin-polarized to produce an initial population of $m_s=\pm 3/2$ states, the first set of laser pulses further producing a first PL signal $PL_{init}$ that is read by a photodetector;

applying a first $B_\perp$ magnetic field pulse to the SiC sample, the first $B_\perp$ magnetic field pulse being orthogonal to the c-axis of the sample and bringing the spin-polarized $m_s=\pm 3/2$ state of the $V_{\overline{Si}}$ defect into a linear superposition state of $m_s=+3/2$ and $m_s=-1/2$ states, the external magnetic field $B_m$ producing a phase difference $\phi(\pi)=\int_0^\tau B_m\,dt$ between the $m_s=+3/2$ and $m_s=-1/2$ components of the linear superposition state;

applying a second $B_\perp$ pulse to the SiC sample, the second $B_\perp$ pulse being orthogonal to the c-axis of the sample, wherein the second $B_\perp$ pulse increases a relaxation time of the $m_s=+3/2$ and $m_s=-1/2$ states of the $V_{\overline{Si}}$ defect so as to increase a sensitivity of the SiC sample to an AC magnetic field incident thereon;

applying a third $B_\perp$ pulse to the SiC sample, the third $B_\perp$ pulse being orthogonal to the c-axis of the sample wherein the third $B_\perp$ pulse redistributes the initial population of spin-polarized $m_s=\pm 3/2$ states in the $V_{\overline{Si}}$ defect the over the $m_s=+3/2$ and $m_s=-1/2$ component states of the linear superposition state so as to convert the phase difference between the $m_s=+3/2$ and $m_s=-1/2$ components into a population difference between the $m_s=+3/2$ and $m_s=-1/2$ states;

applying a second set of laser pulses to the SiC sample, wherein the second set of laser pulses optically excite the $m_s=+3/2$ and $m_s=-1/2$ states in the $V_{\overline{Si}}$ defect and produce a second PL signal $PL_{out}$ upon their relaxation to a ground state, the PL signal $PL_{out}$ being received by the photodetector; and converting a difference $(1-(PL_{out}-PL_{init})/PL_{init})$ between the first and second PL signals into an expression of the external AC magnetic field $B_m$ incident on the sample.

* * * * *